US010381789B2

United States Patent
Smith et al.

(10) Patent No.: US 10,381,789 B2
(45) Date of Patent: Aug. 13, 2019

(54) ACTIVE COVER PLATES

(71) Applicant: SNAPRAYS, LLC, Vineyard, UT (US)

(72) Inventors: Jeremy C. Smith, Orem, UT (US); R. Camden Robinson, Lindon, UT (US); Darren C. Knight, Pleasant Grove, UT (US); Martin Johnson, Draper, UT (US)

(73) Assignee: SnapRays LLC, Vineyard, UT (US)

( * ) Notice: Subject to any disclaimer, the term of this patent is extended or adjusted under 35 U.S.C. 154(b) by 0 days.

(21) Appl. No.: 16/244,838

(22) Filed: Jan. 10, 2019

(65) Prior Publication Data
US 2019/0148892 A1 May 16, 2019

Related U.S. Application Data

(63) Continuation-in-part of application No. 29/676,104, filed on Jan. 8, 2019, and a continuation-in-part of application No. 29/676,102, filed on Jan. 8, 2019, and a continuation-in-part of application No. 16/166,965, filed on Oct. 22, 2018, and a continuation-in-part of application No. 15/708,082, filed on Sep. 18, 2017, said application No. 16/166,965 is a continuation-in-part of application No. 15/920,047, filed on Mar. 13, 2018, and a continuation-in-part of application No. 15/870,832, filed on Jan. 12, 2018, now Pat. No. 10,109,945, and a continuation-in-part of application No. 29/629,812, filed on Dec. 15, 2017, said application No. 15/708,082 is a continuation-in-part of application No. 29/608,292, filed on Jun. 20, 2017, and a continuation-in-part of application No. 29/608,294, filed on Jun. 20, 2017, now Pat. No. Des. 842,075, and a continuation-in-part (Continued)

(51) Int. Cl.
| | |
|---|---|
| *H01R 13/66* | (2006.01) |
| *H02G 3/14* | (2006.01) |
| *H05K 5/03* | (2006.01) |
| *G05F 3/02* | (2006.01) |

(52) U.S. Cl.
CPC .......... *H01R 13/6675* (2013.01); *G05F 3/02* (2013.01); *H02G 3/14* (2013.01); *H05K 5/03* (2013.01)

(58) Field of Classification Search
CPC ........ H01R 13/6675; G05F 3/02; H02G 3/14; H05K 5/03
See application file for complete search history.

(56) References Cited

U.S. PATENT DOCUMENTS 1,938,309 A 12/1933 Williams
2,015,698 A 10/1935 Tiffany
(Continued)

FOREIGN PATENT DOCUMENTS

CA 2732657 2/2011
CN 201311835 9/2009
(Continued)

OTHER PUBLICATIONS

Office Action dated Jan. 26, 2018 for U.S. Reexam 90/014,022.
(Continued)

*Primary Examiner* — Dhiru R Patel

(57) ABSTRACT

A variety of active cover plate configurations with prongs configured to contact side screw terminals of electrical receptacles are described.

26 Claims, 28 Drawing Sheets

Related U.S. Application Data of application No. 29/608,295, filed on Jun. 20, 2017, now Pat. No. Des. 842,076, and a continuation-in-part of application No. 29/608,296, filed on Jun. 20, 2017, and a continuation-in-part of application No. 29/608,297, filed on Jun. 20, 2017, and a continuation-in-part of application No. 29/608,299, filed on Jun. 20, 2017, and a continuation-in-part of application No. 29/608,300, filed on Jun. 20, 2017, and a continuation-in-part of application No. 29/608,301, filed on Jun. 20, 2017, and a continuation-in-part of application No. 15/496,872, filed on Apr. 25, 2017, and a continuation-in-part of application No. 15/486,273, filed on Apr. 12, 2017, now Pat. No. 9,871,324, and a continuation-in-part of application No. 15/486,277, filed on Apr. 12, 2017, now Pat. No. 9,899,814, and a continuation-in-part of application No. 15/486,280, filed on Apr. 12, 2017, now Pat. No. 9,917,430, and a continuation-in-part of application No. 15/481,280, filed on Apr. 6, 2017, now Pat. No. 9,882,318, and a continuation-in-part of application No. 15/481,318, filed on Apr. 6, 2017, now Pat. No. 9,882,361, and a continuation-in-part of application No. 29/599,679, filed on Apr. 5, 2017, now Pat. No. Des. 845,108, and a continuation-in-part of application No. 29/598,255, filed on Mar. 23, 2017, now Pat. No. Des. 819,426, and a continuation-in-part of application No. 29/594,002, filed on Feb. 14, 2017, now Pat. No. Des. 832,223, and a continuation-in-part of application No. 29/594,003, filed on Feb. 14, 2017, and a continuation-in-part of application No. 29/594,005, filed on Feb. 14, 2017, and a continuation-in-part of application No. 29/594,007, filed on Feb. 14, 2017, now Pat. No. Des. 832,224, and a continuation-in-part of application No. 15/428,099, filed on Feb. 8, 2017, now Pat. No. 9,832,841, and a continuation-in-part of application No. 15/409,508, filed on Jan. 18, 2017, now Pat. No. 9,807,829, and a continuation-in-part of application No. 15/145,749, filed on May 3, 2016, now Pat. No. 9,787,025, and a continuation-in-part of application No. 29/551,208, filed on Jan. 11, 2016, now Pat. No. Des. 809,899, and a continuation-in-part of application No. 14/678,746, filed on Apr. 3, 2015, now Pat. No. 9,768,562, and a continuation-in-part of application No. 29/522,406, filed on Mar. 30, 2015, now Pat. No. Des. 810,697, said application No. 15/481,280 is a continuation-in-part of application No. 15/406,404, filed on Jan. 13, 2017, now Pat. No. 9,742,111, said application No. 29/594,002 is a continuation-in-part of application No. 29/522,404, filed on Mar. 30, 2015, now Pat. No. Des. 781,241, said application No. 15/145,749 is a continuation-in-part of application No. 14/549,143, filed on Nov. 20, 2014, now Pat. No. 9,362,728, said application No. 14/678,746 is a continuation of application No. 14/066,637, filed on Oct. 29, 2013, now Pat. No. 9,035,181, said application No. 14/549,143 is a continuation-in-part of application No. 14/066,621, filed on Oct. 29, 2013, now Pat. No. 9,035,180, said application No. 14/066,637 is a continuation-in-part of application No. 13/461,915, filed on May 2, 2012, now Pat. No. 8,912,442.

(60) Provisional application No. 62/579,033, filed on Oct. 30, 2017, provisional application No. 62/536,452, filed on Jul. 24, 2017, provisional application No. 62/522,691, filed on Jun. 21, 2017, provisional application No. 62/460,094, filed on Feb. 17, 2017, provisional application No. 62/279,831, filed on Jan. 18, 2016, provisional application No. 62/081,539, filed on Nov. 18, 2014, provisional application No. 62/027,784, filed on Jul. 23, 2014, provisional application No. 61/906,651, filed on Nov. 20, 2013, provisional application No. 61/836,972, filed on Jun. 19, 2013, provisional application No. 61/778,386, filed on Mar. 12, 2013, provisional application No. 61/720,131, filed on Oct. 30, 2012, provisional application No. 61/574,344, filed on Aug. 1, 2011.

(56) References Cited

U.S. PATENT DOCUMENTS

| | | |
|---|---|---|
| 2,045,199 A | 6/1936 | Petersen |
| 2,193,740 A | 9/1938 | Reed |
| 2,134,695 A | 11/1938 | Bigman |
| 2,227,549 A | 1/1941 | McNeill |
| 2,385,620 A | 9/1945 | Fleckenstein |
| 2,428,167 A | 9/1947 | Linton |
| 2,515,820 A | 7/1950 | Clark |
| 2,575,820 A | 11/1951 | Linton |
| 2,580,056 A | 12/1951 | Wheeler, Jr. |
| 2,749,381 A | 6/1956 | Farish |
| 2,880,285 A | 3/1959 | Robison et al. |
| 2,908,743 A | 10/1959 | Premoshis |
| 2,934,590 A | 4/1960 | Thompson et al. |
| 3,120,414 A | 2/1964 | Farish, Jr. |
| 3,168,612 A | 2/1965 | Sorenson |
| 3,307,030 A | 2/1967 | Francisco |
| D212,760 S | 11/1968 | Bordner |
| 3,522,595 A | 8/1970 | White |
| 3,588,489 A | 6/1971 | Gaines |
| 3,680,237 A | 8/1972 | Finnerty, Sr. |
| 3,739,226 A | 6/1973 | Seiter et al. |
| D230,274 S | 2/1974 | Polus |
| 3,859,454 A | 1/1975 | Mann |
| 3,879,101 A | 4/1975 | McKissic |
| 4,000,405 A | 12/1976 | Horwinski |
| 4,038,582 A | 7/1977 | Horwinski |
| 4,117,258 A | 9/1978 | Shanker |
| 4,255,780 A | 3/1981 | Sakellaris |
| 4,282,591 A | 8/1981 | Andreuccetti |
| 4,514,789 A | 4/1985 | Jester |
| 4,534,486 A | 8/1985 | Eidson |
| 4,546,419 A | 10/1985 | Johnson |
| 4,611,264 A | 9/1986 | Bradley |
| 4,616,285 A | 10/1986 | Sackett |
| 4,617,613 A | 10/1986 | Rice |
| 4,755,913 A | 7/1988 | Sleveland |
| 4,774,641 A | 9/1988 | Rice |
| 5,016,398 A | 5/1991 | Fukunaga |
| D330,267 S | 10/1992 | Hendrix |
| 5,153,816 A | 10/1992 | Griffin |
| 5,186,682 A | 2/1993 | Iida |
| 5,248,919 A | 9/1993 | Hanna |
| 5,290,175 A | 3/1994 | Robinson |
| 5,384,428 A | 1/1995 | Luu |
| 5,406,439 A | 4/1995 | Crane et al. |
| 5,473,517 A | 12/1995 | Blackman |
| D366,339 S | 1/1996 | Waller |
| 5,481,442 A | 1/1996 | Dickie et al. |
| 5,485,356 A | 1/1996 | Nguyen |
| 5,584,725 A | 12/1996 | Tseng |
| 5,622,424 A | 4/1997 | Brady |
| 5,660,459 A | 8/1997 | Appelberg |
| 5,670,776 A | 9/1997 | Rothbaum |
| 5,683,166 A | 11/1997 | Lutzker |
| D395,314 S | 6/1998 | Oikawa |
| D399,825 S | 10/1998 | Heung et al. |
| 5,816,682 A | 10/1998 | Marischen |
| D401,566 S | 11/1998 | Gesmondi |
| 5,833,350 A | 11/1998 | Moreland |

(56) References Cited

U.S. PATENT DOCUMENTS

| | | |
|---|---|---|
| D407,072 S | 3/1999 | Gaule |
| 5,914,826 A | 6/1999 | Smallwood |
| 6,000,807 A | 12/1999 | Moreland |
| 6,010,228 A | 1/2000 | Blackman |
| 6,023,021 A | 2/2000 | Matthews et al. |
| D427,086 S | 6/2000 | Gaule |
| 6,087,588 A | 7/2000 | Soules |
| 6,089,893 A | 7/2000 | Yu et al. |
| D429,829 S | 8/2000 | Doran |
| D443,500 S | 6/2001 | Luu |
| 6,310,291 B1 * | 10/2001 | Clough ............... H01R 13/6395 174/66 |
| 6,341,981 B1 | 1/2002 | Gorman |
| D456,239 S | 4/2002 | Luu |
| 6,390,647 B1 | 5/2002 | Shaefer |
| 6,395,981 B1 | 5/2002 | Ford et al. |
| 6,423,900 B1 | 7/2002 | Soules |
| D464,865 S | 10/2002 | Luu |
| 6,457,843 B1 | 10/2002 | Kester |
| D473,528 S | 4/2003 | Wengrower |
| 6,547,411 B1 | 4/2003 | Dornbusch |
| 6,608,253 B1 | 8/2003 | Rintz |
| 6,765,149 B1 | 7/2004 | Ku |
| 6,774,328 B2 | 8/2004 | Adams et al. |
| 6,805,469 B1 | 10/2004 | Barton |
| 6,808,283 B2 | 10/2004 | Tsao |
| D500,743 S | 1/2005 | Saviki, Jr. et al. |
| 6,867,370 B2 | 3/2005 | Compagnone |
| 6,883,927 B2 | 4/2005 | Cunningham et al. |
| 6,891,284 B2 | 5/2005 | Tilley |
| 6,974,910 B2 | 12/2005 | Rohmer |
| 7,011,422 B2 | 3/2006 | Robertson et al. |
| 7,019,212 B1 | 3/2006 | Esmailzadeh |
| 7,036,948 B1 | 5/2006 | Wyatt |
| 7,064,498 B2 | 6/2006 | Dowling et al. |
| D542,627 S | 5/2007 | Rohmer et al. |
| 7,247,793 B2 | 7/2007 | Hinkson |
| 7,270,436 B2 | 9/2007 | Jasper |
| 7,273,983 B1 | 9/2007 | Rintz |
| 7,318,653 B2 | 1/2008 | Chien |
| D561,558 S | 2/2008 | Jackson |
| D561,559 S | 2/2008 | Krumpe |
| D567,633 S | 4/2008 | Anderson |
| 7,360,912 B1 | 4/2008 | Savicki, Jr. |
| D573,005 S | 7/2008 | Huang |
| D576,566 S | 9/2008 | Wu et al. |
| D577,985 S | 10/2008 | Kidman |
| 7,506,990 B2 | 3/2009 | Glazner |
| 7,547,131 B2 | 6/2009 | Faunce et al. |
| 7,576,285 B1 | 8/2009 | Saviki, Jr. |
| D603,984 S | 11/2009 | Richter |
| D606,029 S | 12/2009 | Chou |
| 7,745,750 B2 | 6/2010 | Hewson et al. |
| 7,821,160 B1 | 10/2010 | Roosli et al. |
| 7,850,322 B2 | 12/2010 | Glazner et al. |
| 7,918,667 B1 | 4/2011 | Shim |
| 7,946,871 B1 | 5/2011 | Yu et al. |
| 8,003,886 B1 | 8/2011 | Rintz |
| 8,063,303 B1 * | 11/2011 | McBain ............... H01R 13/4534 174/66 |
| D650,112 S | 12/2011 | Bryant |
| 8,148,637 B2 | 4/2012 | Davidson |
| D666,471 S | 9/2012 | Peckham |
| 8,304,652 B2 | 11/2012 | McBain |
| 8,393,747 B2 | 3/2013 | Kevelos et al. |
| 8,511,866 B1 | 8/2013 | Mendez |
| 8,564,279 B2 | 10/2013 | Johnson et al. |
| 8,668,347 B2 | 3/2014 | Ebeling |
| 8,697,991 B2 | 4/2014 | Davidson |
| 8,797,723 B2 | 8/2014 | Hilton et al. |
| D719,699 S | 12/2014 | Bryant |
| 8,912,442 B2 | 12/2014 | Smith |
| D721,043 S | 1/2015 | Tonnesen |
| 9,035,180 B2 | 5/2015 | Smith et al. |
| 9,035,181 B2 | 5/2015 | Smith et al. |
| 9,362,728 B2 | 6/2016 | Smith et al. |
| 9,464,795 B2 | 10/2016 | Ebeling |
| 9,482,426 B2 | 11/2016 | Diotte |
| 9,742,111 B2 | 8/2017 | Smith et al. |
| 9,755,374 B2 | 9/2017 | St. Laurent et al. |
| 9,768,562 B2 | 9/2017 | Smith et al. |
| 9,774,154 B2 | 9/2017 | St. Laurent et al. |
| 9,787,025 B2 | 10/2017 | Smith et al. |
| 9,807,829 B2 | 10/2017 | Jensen |
| 9,832,841 B2 | 11/2017 | Knight et al. |
| 9,871,324 B2 | 1/2018 | Smith et al. |
| 9,882,318 B2 | 1/2018 | Smith et al. |
| 9,882,361 B2 | 1/2018 | Smith et al. |
| 9,899,814 B2 | 2/2018 | Smith et al. |
| 9,917,430 B2 | 3/2018 | Smith et al. |
| 10,109,945 B2 | 10/2018 | Smith et al. |
| 2001/0046130 A1 | 11/2001 | Cunningham et al. |
| 2002/0131262 A1 | 9/2002 | Amburgey |
| 2003/0013503 A1 | 1/2003 | Menard et al. |
| 2003/0124022 A1 | 7/2003 | Georges et al. |
| 2004/0247300 A1 | 12/2004 | He et al. |
| 2005/0264383 A1 | 12/2005 | Zhang |
| 2006/0065510 A1 | 3/2006 | Kiko et al. |
| 2006/0072302 A1 | 4/2006 | Chien |
| 2006/0077684 A1 | 4/2006 | Yuen |
| 2006/0161270 A1 | 7/2006 | Luskin et al. |
| 2006/0170380 A1 | 8/2006 | Evans |
| 2006/0262462 A1 | 11/2006 | Barton |
| 2007/0120978 A1 | 5/2007 | Jones |
| 2008/0073117 A1 | 3/2008 | Misener |
| 2008/0266121 A1 | 10/2008 | Ellul |
| 2009/0153438 A1 | 6/2009 | Miller et al. |
| 2009/0225480 A1 | 9/2009 | Baxter |
| 2009/0284385 A1 | 11/2009 | Tang et al. |
| 2009/0322159 A1 | 12/2009 | Dubose et al. |
| 2010/0033950 A1 | 2/2010 | Farrell |
| 2011/0056720 A1 | 3/2011 | Davidson |
| 2011/0210833 A1 | 9/2011 | McNeely et al. |
| 2011/0228552 A1 | 9/2011 | Kevelos et al. |
| 2012/0008307 A1 | 1/2012 | Delany |
| 2012/0068612 A1 | 3/2012 | Ebeling |
| 2012/0156937 A1 | 6/2012 | Almouli |
| 2012/0182172 A1 | 7/2012 | Sorensen |
| 2012/0215470 A1 | 8/2012 | Maguire |
| 2012/0316808 A1 | 12/2012 | Frader-Thompson et al. |
| 2013/0063848 A1 | 3/2013 | Thorpe et al. |
| 2013/0076242 A1 | 3/2013 | Moreland |
| 2013/0221868 A1 | 8/2013 | Diotte et al. |
| 2015/0371534 A1 | 12/2015 | Dimberg et al. |
| 2017/0018890 A1 | 1/2017 | St. Laurent et al. |
| 2017/0018897 A1 | 1/2017 | St. Laurent et al. |
| 2017/0214188 A1 | 7/2017 | Smith |
| 2018/0048099 A1 | 2/2018 | Diotte |

FOREIGN PATENT DOCUMENTS

| | | |
|---|---|---|
| DE | 202006006354 | 10/2007 |
| EP | 2211210 | 3/2007 |
| KR | 1019930025223 | 6/1995 |
| KR | 1019950015932 | 6/1995 |
| KR | 20090121424 | 11/2009 |
| KR | 1020080047328 | 11/2009 |
| KR | 100955064 | 4/2010 |
| KR | 1020090098056 | 4/2010 |
| WO | 2007122141 | 11/2007 |
| WO | 2012006812 | 1/2012 |
| WO | 2012033746 | 3/2012 |
| WO | 2013019394 | 2/2013 |
| WO | 2014070863 | 5/2014 |

OTHER PUBLICATIONS

Office Action dated Feb. 23, 2018 for U.S. Re-exam Application No. 90/014,021.

Office Action dated Sep. 20, 2018 for U.S. Appl. No. 15/920,047.

Permaglo Night Light, www.costco.ca, accessed Mar. 21, 2017, 4 pgs.

(56) References Cited

OTHER PUBLICATIONS

Permaglo Safety Lighting Products, www.pemaglo.com, accessed Mar. 21, 2017, 1 pg.
Request for Ex Parte Reexamination for U.S. Pat. No. 9,035,180, May 19, 2015.
TekSyCo Technical Systems Company—Plug into the Future, at least as early as Jul. 16, 2009.
Request for Ex Parte Reexamination for U.S. Pat. No. 8,912,442 ,May 19, 2015.
Decorator Combination Tamper-Resistant Nightlight/GFCI, White 1595NTL54WCC4. Datasheet (online). Legrand http://www.legrand.us/PassAndSeymour/GFCI/GFCI-Receptacles/Tamper-Resistant/Combination-Nightlight-GFCI-Receptacle/1595NTITRWCC4.aspx ,May 20, 2012.
LED Nightlight. Datasheet (online). Feit Electric http://letsgogreen.biz/pages/nightlights.html ,May 2012.
Leviton Glow Guide Night Light. Datasheet (online). Leviton. http://www.amazon.com/Leviton-Glow-Guide-Night-Light/dp/B000GYF8XY/ref=sr_1_2?s=home-garden&ie=UTF8&qid=1299008596&sr-1-21 ,May 2012.
Louvered Recessed Night Light with 10 Watts. Datasheet (online). American Lighting LLC http://www.csnstores.com/American-Lighting-LLC-RNLS-1-ali923.html?cv ,May 2012.
Louvered Recessed Night Light with 2x.25 Watt LED. Datasheet (online). American Lighting, LLC. http://www.csnstores.com/American-Lighting-LLC-RNLS-3-ali1927.html ,May 2012.
NL3/LED Three LED Sensor Night Light plus 3-plug Outlet. Datasheet (online). Feit Electric http://www.amazon.com/Feit-Electric-NL#-LED-Sensor/dp/B000I1AC0/ref=sr_1)48?s=home-garden&ie=UTF8&qid=1299008626&sr=1-48 ,May 2012.
8 LED Nightlights. Datasheet (online). Feit Electric hppp://www.amazon.com/Feit-Electric-8-LED-Nightlights/dp/B001OZ33FY/ref=sr_1_50?s=home-garden&ie=UTF8&quid-1299008671&sr=1-50 ,May 2017.
Initial Expert Report of Michael Thuma.
Ontel answer and Affirmative Defenses to Plaintiff's Second Amended Complaint, U.S. District Court filing ,Jun. 5, 2017.
Ontel Defendants LPR 2.2(b) Initial Disclosures, U.S. District Court filing ,Jul. 14, 2017.
Ontel Defendants LPR 2.4 Preliminary Non-Infringement and Invalidity Contentions ,Aug. 8, 2017
Ontel Defendants Memorandum in Opposition to Plaintiff's Motion for Leave to File a Second Amended Complaint, U.S. District Court filing ,Apr. 11, 2017.
Pass & Seymore/Legrand Keeps Kids Safer with Over 100 Kinds of Tamper-Resistant Electrical Outlets, PR Newswire news alert, visited Oct. 2018 ,Feb. 2008.
Plate Pals Wallplate Thermometers, http://www.platepats.com/home.html. Last visited Apr. 12, 2017. ,2006.
Respondent Alltrade Tools LLC's Invladity Contentions—Service.
Respondent Alltrade Tools LLC's Notice of Prior Art.
Respondent Alltrade Tools LLC's Second Supplemental Invalidity Contentions.
Respondent Alltrade Tools LLC's Supplemental Invalidity Contentions.
Respondent Enstant Technology Co., Ltd.'s Response to Compainant Snaprays, LLC's Invalidity Contentions Interrogatories.
Respondent Ontel Products Corporation's Notice of Prior Art.
Respondents Enstant Technology Co., Ltd. and Vistek Technology Co., Lts.'s Notice of Prior Art.
UL Warns of Light with Unauthorized UL Mark, The Associated Press New Alert, visited Oct. 2018 ,Jul. 2009.
International Search Report for PCT/US2011/050524, pp. 1-3, dated Mar. 28, 2012.
Written Opinion of the International Searching Aurhtority for PCT/US2011/050524, pp. 1-3, dated Mar. 7, 2013.
International Preliminary Report on Patentability for PCT/US2011/050524, pp. 1-4, dated Mar. 13, 2013.
U.S. Appl. No. 61/380,561 made publicly accessible with U.S. Patent Application Publication No. 2013/0221868 on Aug. 29, 2013, pp. 1-19.

\* cited by examiner

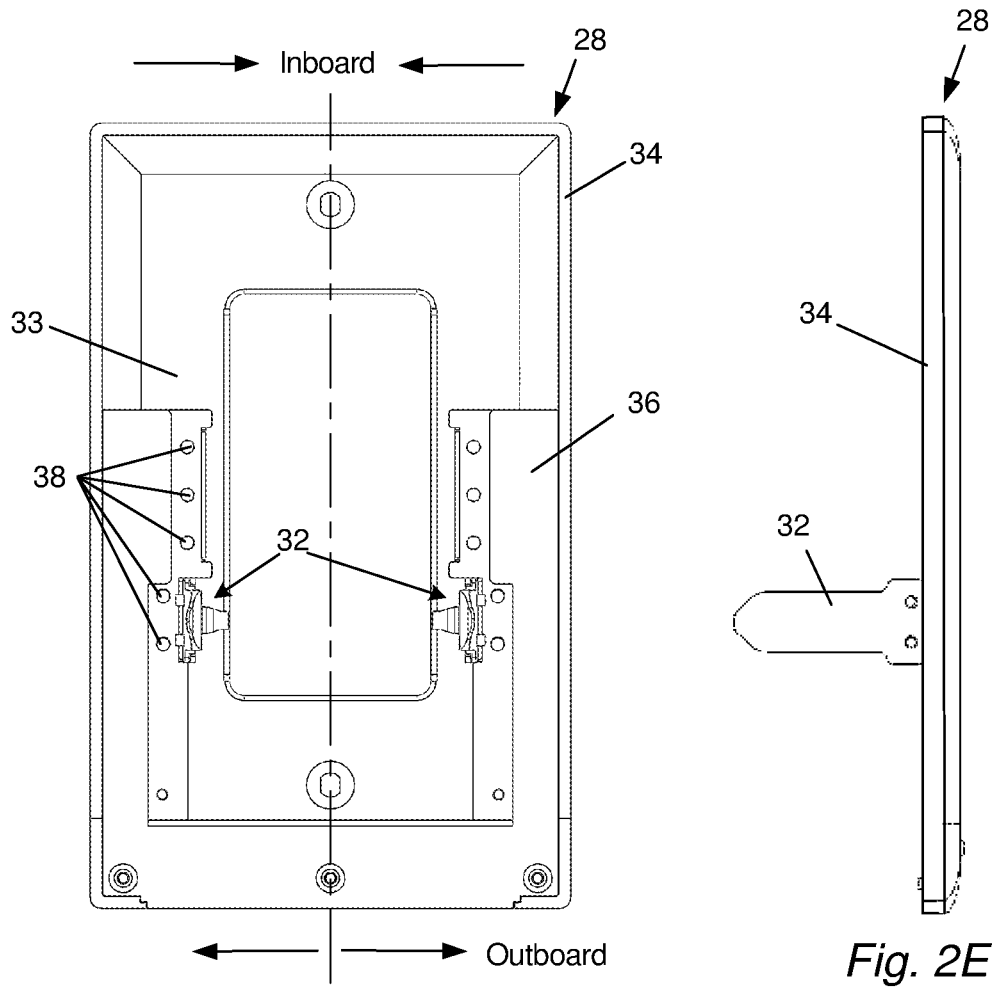
*Fig. 2D*
*Fig. 2E*
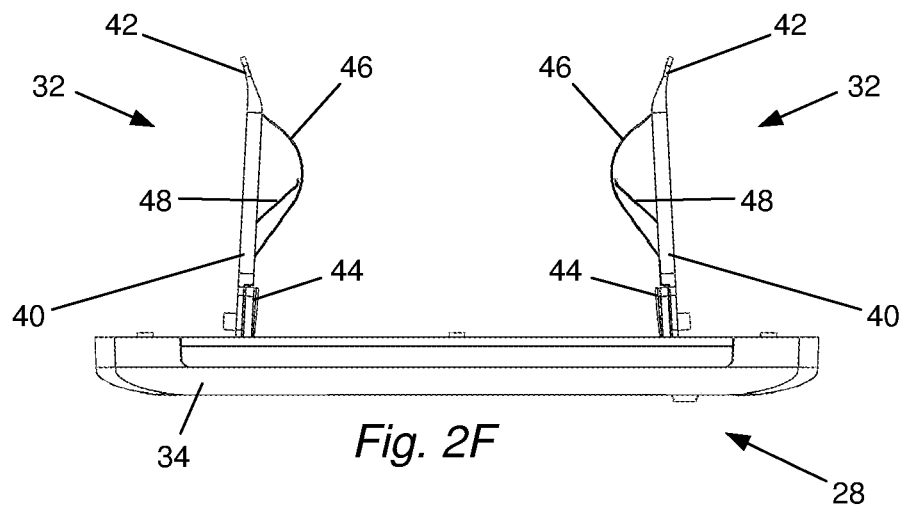
*Fig. 2F*

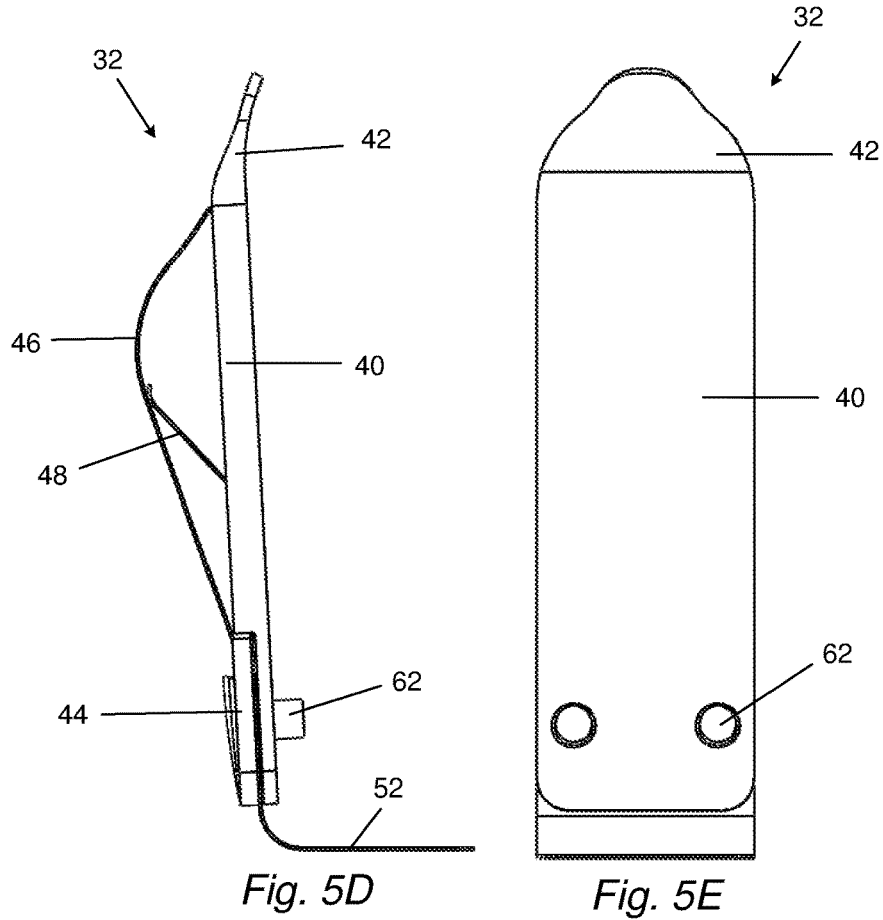
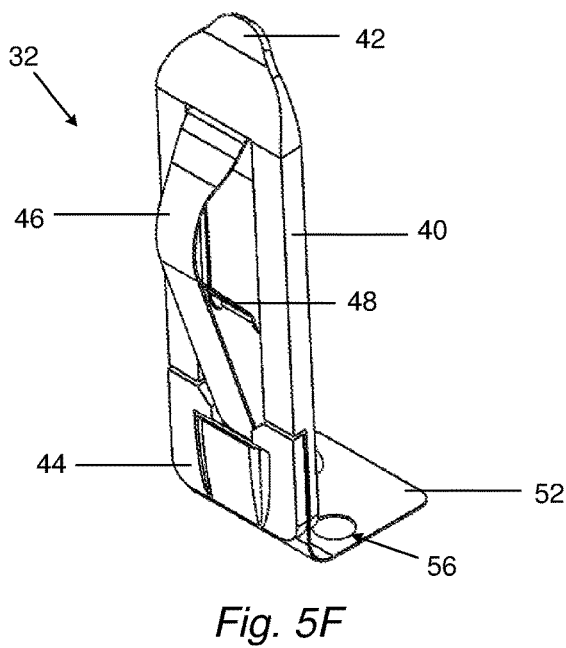
Fig. 5D  Fig. 5E
Fig. 5F

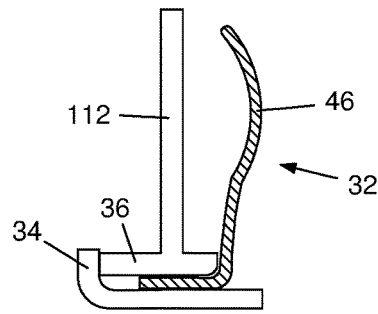
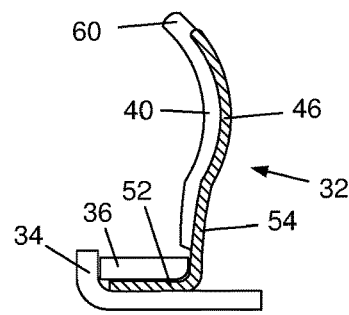
Fig. 10A
Fig. 10B
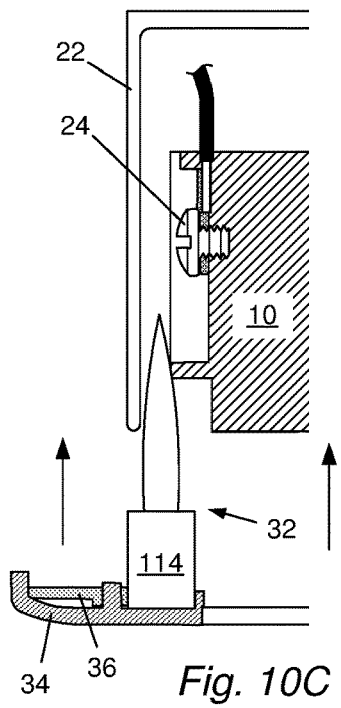
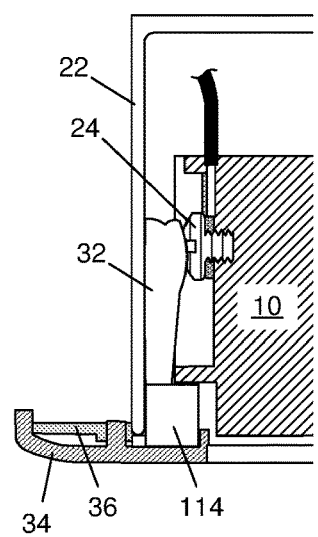
Fig. 10C
Fig. 10D
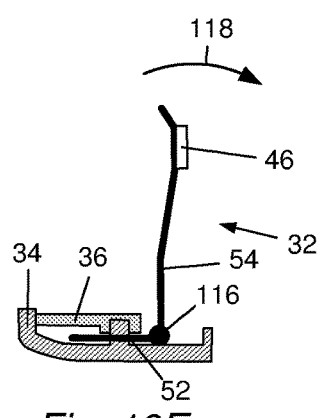
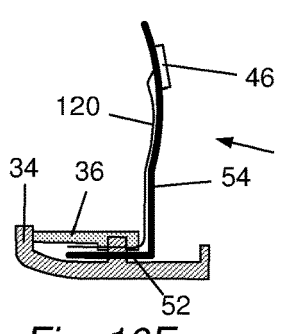
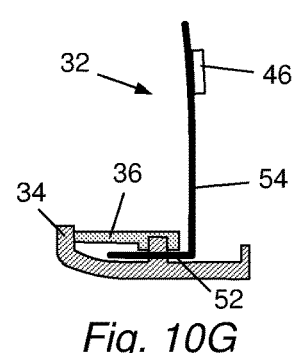
Fig. 10E
Fig. 10F
Fig. 10G

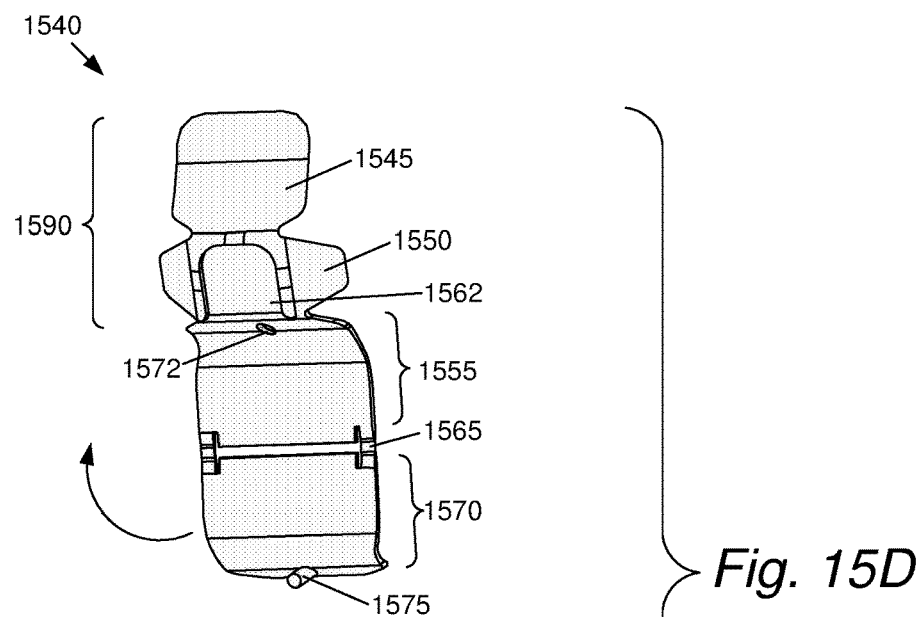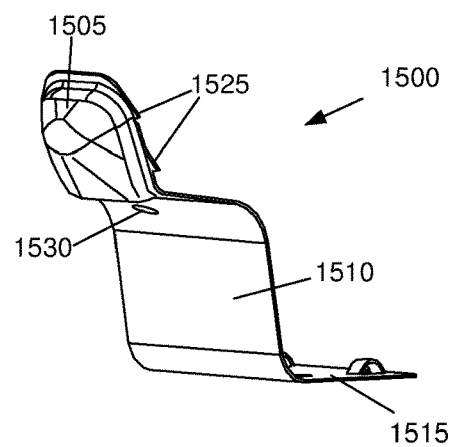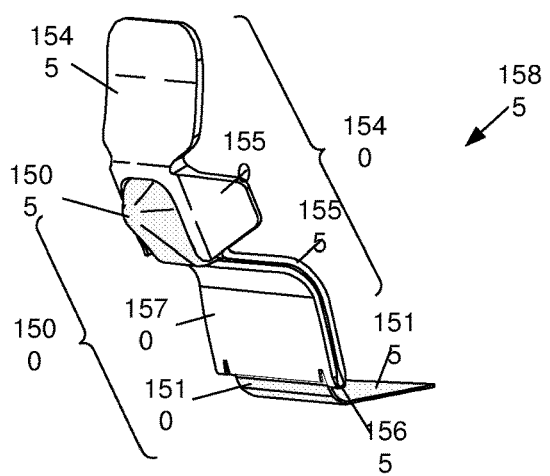
Fig. 15D
Fig. 15E

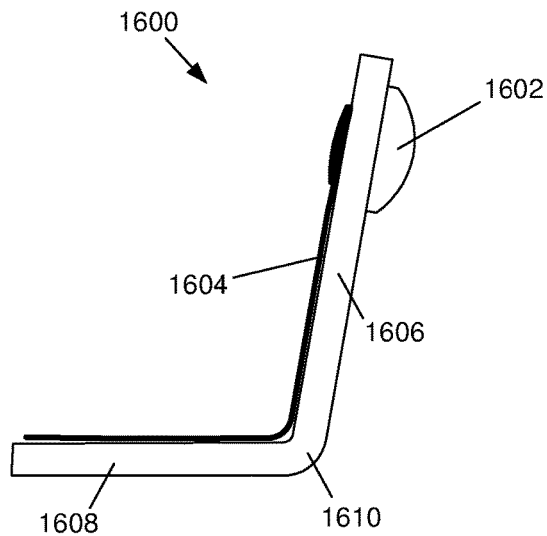
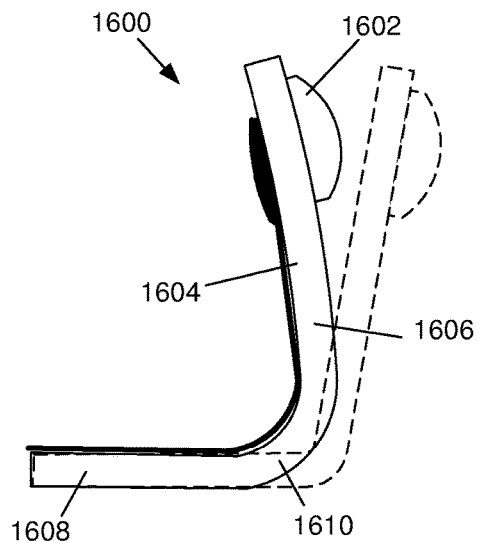
Fig. 16A
Neutral position
Fig. 16B
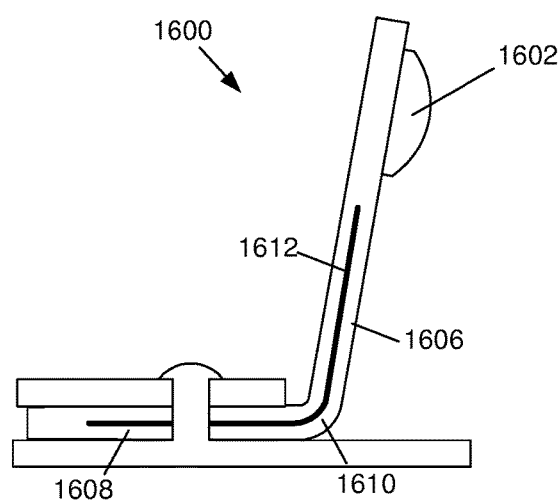
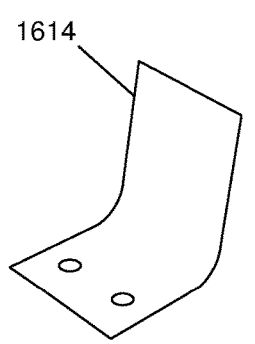
Fig. 16C
Fig. 16D
Fig. 16E

ACTIVE COVER PLATES

RELATED APPLICATIONS

The present application incorporates the following applications and patents by reference in their entireties:

U.S. Provisional Application No. 62/579,033, filed on Oct. 30, 2017;

U.S. Provisional Application No. 62/536,452, filed on Jul. 24, 2017;

U.S. Provisional Application No. 62/522,691, filed on Jun. 21, 2017;

U.S. Provisional Application No. 62/460,094, filed on Feb. 17, 2017;

U.S. Provisional Application No. 62/279,831, filed on Jan. 18, 2016;

U.S. Provisional Application No. 62/081,539, filed on Nov. 18, 2014;

U.S. Provisional Application No. 62/027,784, filed on Jul. 23, 2014;

U.S. Provisional Application No. 61/906,651, filed on Nov. 20, 2013;

U.S. Provisional Application No. 61/836,972, filed on Jun. 19, 2013;

U.S. Provisional Application No. 61/778,386, filed on Mar. 12, 2013;

U.S. Provisional Application No. 61/720,131, filed on Oct. 30, 2012;

U.S. Provisional Application No. 61/574,344, filed on Aug. 1, 2011;

U.S. Design patent application No. 29/676,104, filed on Jan. 8, 2019;

U.S. Design patent application No. 29/676,102, filed on Jan. 8, 2019;

U.S. Design patent application No. 29/629,812, filed on Dec. 15, 2017;

U.S. Design patent application No. 29/608,301, filed on Jun. 20, 2017;

U.S. Design patent application No. 29/608,300, filed on Jun. 20, 2017;

U.S. Design patent application No. 29/608,299, filed on Jun. 20, 2017;

U.S. Design patent application No. 29/608,297, filed on Jun. 20, 2017;

U.S. Design patent application No. 29/608,296, filed on Jun. 20, 2017;

U.S. Design patent application No. 29/608,295, filed on Jun. 20, 2017, issued as U.S. Pat. No. D842,076;

U.S. Design patent application No. 29/608,294, filed on Jun. 20, 2017, issued as U.S. Pat. No. D842,075;

U.S. Design patent application No. 29/608,292, filed on Jun. 20, 2017;

U.S. Design patent application No. 29/599,679, filed on Apr. 5, 2017;

U.S. Design patent application No. 29/598,255, filed on Mar. 23, 2017, issued as U.S. Pat. No. D819,426;

U.S. Design patent application No. 29/594,007, filed on Feb. 14, 2017, issued as U.S. Pat. No. D832,224;

U.S. Design patent application No. 29/594,005, filed on Feb. 14, 2017;

U.S. Design patent application No. 29/594,003, filed on Feb. 14, 2017;

U.S. Design patent application No. 29/594,002, filed on Feb. 14, 2017, issued as U.S. Pat. No. D832,223;

U.S. Design patent application No. 29/551,208, filed on Jan. 11, 2016, issued as U.S. Pat. No. D809,899;

U.S. Design patent application No. 29/522,406, filed on Mar. 30, 2015, issued as U.S. Pat. No. D810,697;

U.S. Design patent application No. 29/522,404, filed on Mar. 30, 2015, issued as U.S. Pat. No. D781,241;

U.S. patent application Ser. No. 16/166,965, filed on Oct. 22, 2018;

U.S. patent application Ser. No. 15/920,047, filed on Mar. 13, 2018;

U.S. patent application Ser. No. 15/870,832, filed on Jan. 12, 2018, issued as U.S. Pat. No. 10,109,945;

U.S. patent application Ser. No. 15/708,082, filed on Sep. 18, 2017;

U.S. patent application Ser. No. 15/496,872, filed on Apr. 25, 2017, published as US 2017-0229853 A1;

U.S. patent application Ser. No. 15/486,280, filed on Apr. 12, 2017, published as US 2017-0222417 A1; issued as U.S. Pat. No. 9,917,430;

U.S. patent application Ser. No. 15/486,277, filed on Apr. 12, 2017, published as US 2017-0222414 A1, issued as U.S. Pat. No. 9,899,814;

U.S. patent application Ser. No. 15/486,273, filed on Apr. 12, 2017, published as US 2017-0222364 A1, issued as U.S. Pat. No. 9,871,324;

U.S. patent application Ser. No. 15/481,318, filed on Apr. 6, 2017, published as US 2017-0214229 A1, issued as U.S. Pat. No. 9,882,361;

U.S. patent application Ser. No. 15/481,280, filed on Apr. 6, 2017, published as US 2017-0214188 A1, issued as U.S. Pat. No. 9,882,318;

U.S. patent application Ser. No. 15/428,099; filed on Feb. 8, 2017, published as US 2017-0208663 A1, issued as U.S. Pat. No. 9,832,841;

U.S. patent application Ser. No. 15/409,508, filed on Jan. 18, 2017, published as US 2017-0208657 A1, issued as U.S. Pat. No. 9,807,829;

U.S. patent application Ser. No. 15/406,404, filed on Jan. 13, 2017, published as US 2017-0125947 A1, issued as U.S. Pat. No. 9,742,111;

U.S. patent application Ser. No. 15/145,749; filed on May 3, 2016, published as US 2016-0248202 A1, issued as U.S. Pat. No. 9,787,025;

U.S. patent application Ser. No. 14/678,746, filed on Apr. 3, 2015, published as US 2015-0229079 A1, issued as U.S. Pat. No. 9,768,562;

U.S. patent application Ser. No. 14/549,143, filed on Nov. 20, 2014, published as US 2015-0075836 A1, issued as U.S. Pat. No. 9,362,728;

U.S. patent application Ser. No. 14/066,637, filed on Oct. 29, 2013, published as US 2014-0054060 A1, issued as U.S. Pat. No. 9,035,181;

U.S. patent application Ser. No. 14/066,621, filed on Oct. 29, 2013, published as US 2014-0054059 A1, issued as U.S. Pat. No. 9,035,180; and U.S. patent application Ser. No. 13/461,915, filed on May 2, 2012, published as US 2013-0032594 A1, issued as U.S. Pat. No. 8,912,442.

BACKGROUND

Modern buildings include wiring to deliver electrical power to lights, outlets, and other devices. The electrical wiring typically terminates in an electrical box in a wall, ceiling, floor or the box may be connected to another structural element. Connections are made to the wiring in the electrical box. For example, electrical wiring may be connected to outlets and switches by stab-in connectors or with screw terminals on the sides of the outlet/switch body. After installation, a wall plate is placed over the outlet/switch body to cover the opening to the box while allowing access to the outlet receptacles and/or access to manually manipulate the switch(s).

BRIEF DESCRIPTION OF THE DRAWINGS

The accompanying drawings illustrate various examples of the principles described herein and are a part of the specification. The illustrated examples are merely examples and do not limit the scope of the claims.

FIGS. 2A-2K are diagrams and images of an illustrative GFCI active cover plate and various prongs for use with the active cover plate, according to one example of principles described herein.

FIGS. 5A-5I show various illustrative GFCI prongs for a GFCI active cover plate, according to one example of principles described herein.

FIGS. 10A-10G show various illustrative examples of prongs for a GFCI active cover plate, according to one example of principles described herein.

FIGS. 15A-15E show an illustrative example of a prong for active cover plates, according to one example of principles described herein.

FIGS. 16A-16E show various illustrative examples of stiffening member/resilient insert for prongs on active cover plates, according to one example of principles described herein.

Throughout the drawings, identical reference numbers designate similar, but not necessarily identical, elements.

DETAILED DESCRIPTION

Reference will now be made to the figures wherein like structures will be provided with like reference designations. In the following description, for purposes of explanation, numerous specific details are set forth in order to provide a thorough understanding of the present systems and methods. It will be apparent, however, that systems and methods may be practiced without these specific details. It is understood that the figures are diagrammatic and schematic representations of some embodiments of the invention, and are not limiting of the present invention, nor are they necessarily drawn to scale. Reference in the specification to "an example" or similar language means that a particular feature, structure, or characteristic described in connection with the example is included in at least that one example, but not necessarily in other examples. Additionally, features shown and/or described in connection with one figure may be combined with features shown and/or described in connection with other figures.

Figure 1A:
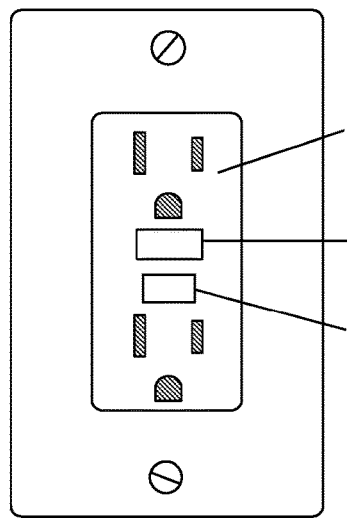
FIGS. 1A-1C are drawings of GFCI outlet installations, according to one example of principles described herein.
Figure 1B:
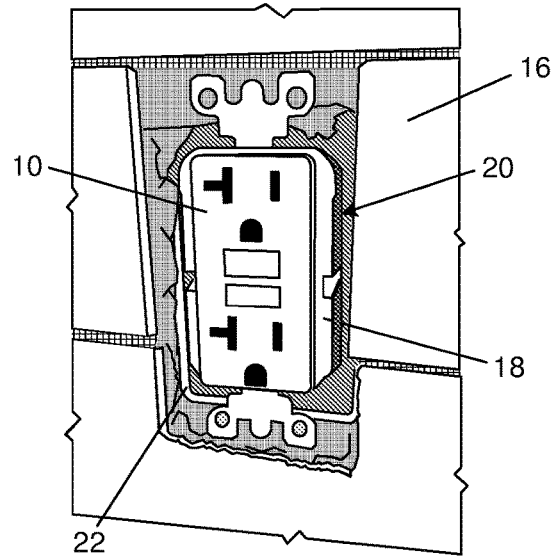
Figure 1C:
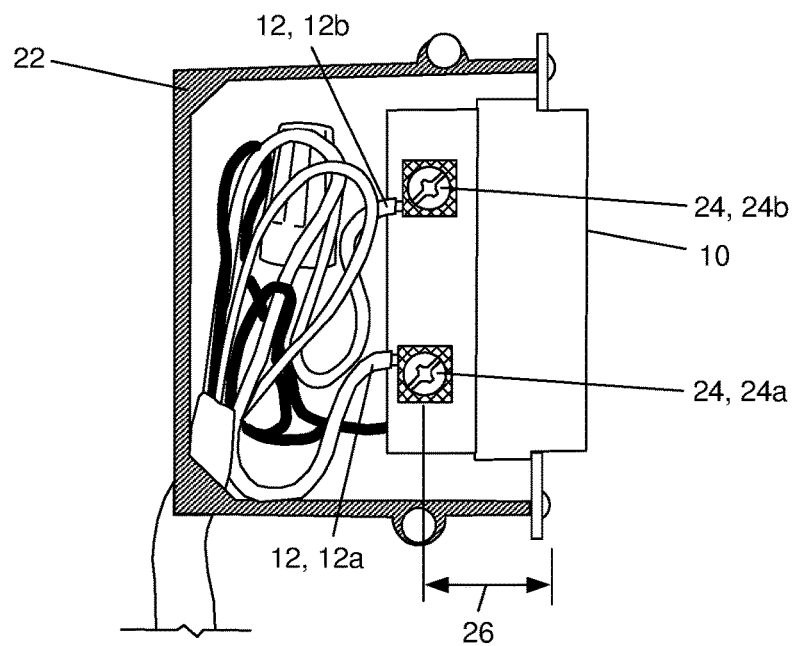

FIGS. 1A-1C show various views of ground fault circuit interrupter (GFCI) outlets 10. GFCI outlets 10 are designed to quickly and automatically disconnect a circuit when they detect that the electric current is not balanced between the energized (line) conductor(s) and the return (neutral) conductor. Under normal circumstances, these two wires are expected to carry matching currents, and any difference may indicate that a short circuit or other electrical anomaly is present, such as leakage. There may be a variety of different configurations of the screw terminals and GFCI outlet geometry. For example, the hot and neutral wires may be on opposite sides of the GFCI outlet. Additionally, there may be load screw terminals that are connected to outlets "downstream/daisy chained" from the GFCI outlet. These downstream outlets may also be benefited by the GFCI protection.

Leakage may indicate a shock hazard (or shock in progress) which is a potential danger to a person. Current leakage may result in harm or death due to electric shock, especially if the leaking electric current passes through the torso of a human. A current of around 30 mA (0.030 amperes) may be sufficient to cause cardiac arrest or serious harm if it persists for more than a fraction of a second.

GFCI outlets 10 are designed to disconnect the conducting wires 12 quickly enough to prevent serious injury from such shocks. The buttons 14a, 14b on the face of the GFCI outlet 10 are "test" and "reset" buttons. The test button 14a may cause a small amount of power to be sent to ground or a neutral wire, simulating a short. When the test button 14a is depressed, the GFCI should disconnect ("trip") and power to the outlet 10 should be disconnected.

After a trip event, the "reset" button 14a may be depressed to reset the GFCI configuration and reenergize the outlet 10. The buttons 14a, 14b are shown in FIG. 1A. In this example, the reset button 14b is the larger button and the test button 14a is the smaller button. Other GFCI outlets 10 may have different configurations. GFCI outlets 10 may also be known as "residual current devices"; ground fault interrupters "GFI"; and more sophisticated versions may include arc fault circuit interrupters ("AFCI," "AFCI/GFCI" or "AF/GF").

FIG. 1B shows a GFCI outlet 10 installed in a wall with a tile wall covering 16. GFCI outlets 10 may be wider (e.g., have wider shoulders 18) than standard outlets because of the additional circuitry and electrical components that they contain. Consequently, there may be a relatively small gap 20 between the sides of the outlet 10 and the sides of the electrical/receptacle box 22 in which the outlet 10 is installed. This can have significant consequences for active cover plates that use prongs to contact screw terminals 24 of GFCI outlets 10. The prongs should fit in the open space 20 between the GFCI outlet 10 and the box 22 in order to reach the screw terminals 24 on the sides of the GFCI outlet 10. The smaller the space 20, the thinner the prongs must be to fit.

FIG. 1C shows a side view of a GFCI outlet 10 installed in a receptacle box 22. One side of the receptacle box 22 has been cut away to allow for a clear view into the box 22 and behind the GFCI outlet 10. There are several things that can be noted from this picture. First, the screw terminals 24 are not located in the same position as a standard outlet. The screw terminals 24 are farther back and recessed into the body of the outlet 10 (i.e., there is a greater distance 26 between the front of the outlet 10 and the screw terminals 24). Presumably the designers recessed the screw terminals 24 to allow wires to make connections without causing the GFCI outlet width to increase beyond its already significant size.

GFCI outlets 10 typically include four screw terminals 24, two on each side. A first set of opposing screw terminals 24b may be designated as "line" terminals. The house wiring 12 that supplies power to the outlet 10 may be connected there, with the hot line connected to one terminal and the neutral line connected to the other terminal.

A second set of opposing screw terminals 24a may also be located on the body of a GFCI outlet 10. This other set of screw terminals 24a may be designated as the "load" screw terminals 24. These load screw terminals 24a may not be used when the GFCI outlet 10 is used by itself. However, additional outlets may be connected to the GFCI outlet 10 ("daisy chained") using the load screw terminals 24a. These additional "daisy chained" outlets may be standard outlets, but because they are connected to power through the GFCI outlet 10 they may also be protected from ground faults by the GFCI outlet 10.

In selected embodiments, an active cover plate designed for GFCI outlets 10 may be connected to either the line or load terminals 24. If the active cover plate is connected to the line terminals 24b (the other line terminal may be on the opposite side of the GFCI outlet), it will be powered regardless of the operation of the GFCI outlet 10. For example, if the GFCI were to detect a fault and trip, the active cover plate may remain on and functioning. The active cover plate may have its own internal current-limiting safeguards. Conversely, if the active cover plate were connected to the load terminals 24a (the other load screw terminal may be on the opposite side of the GFCI outlet 10), it may act like any other circuit that is connected through the GFCI outlet 10 and have additional protection against ground faults.

As illustrated in FIG. 1C, there can be a large number of wires 12 packed behind a GFCI outlet 10. Because the body of the GFCI outlet 10 may be larger than the bodies of standard outlets, the wires 12 may be more tightly packed behind it. In some embodiments, the prongs of the active cover plate may have specific features that are designed to avoid contacting the wires 12 behind the GFCI outlet 10.

For example, the wires 12 may prevent the active cover plate/functional wall plate from installing because the prongs jam into the wires 12. Additionally or alternatively, the prongs may be lifted off the screw terminals 24 as they encounter wires 12. The setback distance 26 from the outlet mount to the screw terminal 24 is also designated in the figure. The setback distance 26 may change between various models of GFCI outlets 10 and can place additional compatibility requirements on prongs that are designed for use with a wide range of GFCI outlets 10.

Figure 2A:
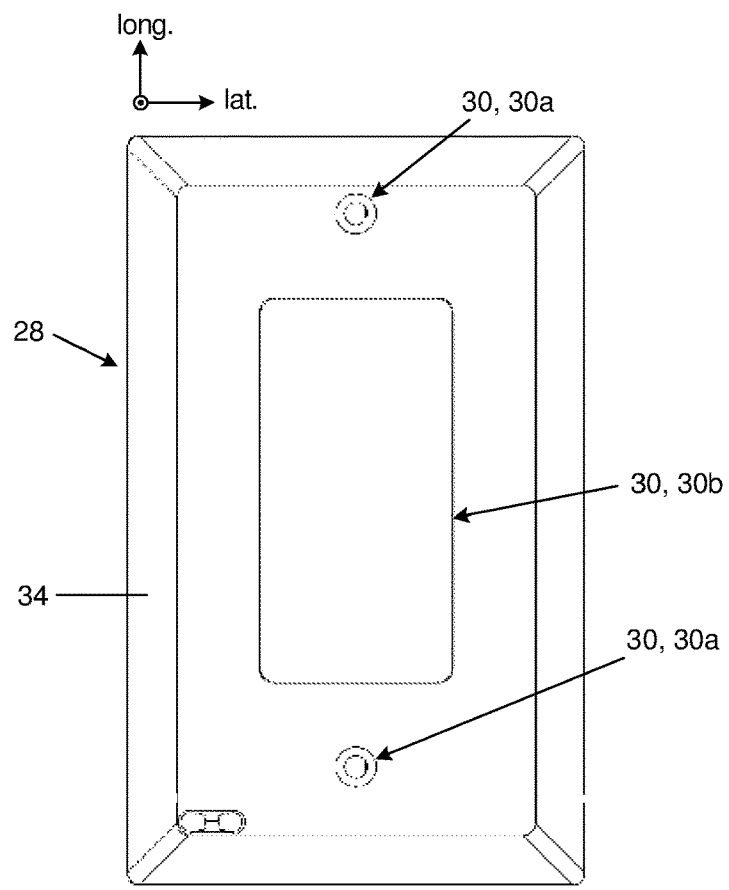
Figure 2B:
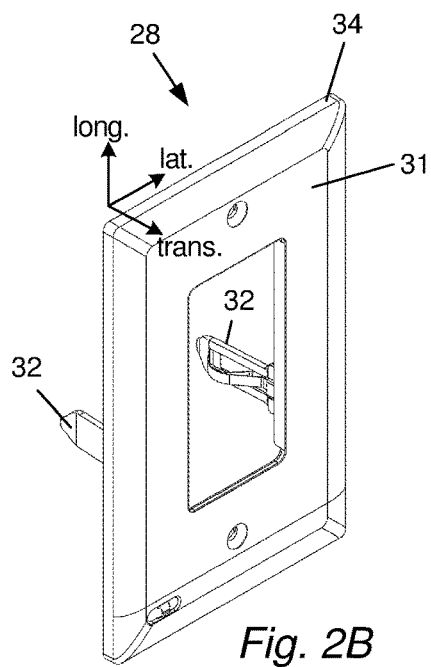
Figure 2C:
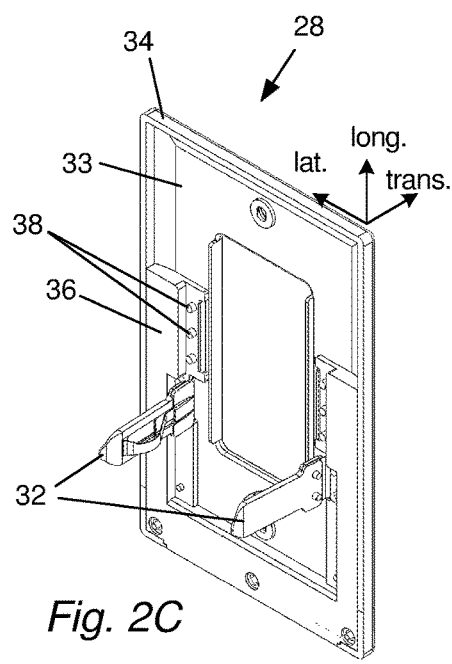

The remaining figures and associated text in the application show various embodiments of active cover plates and prongs that are configured to make contact with electrical receptacles. These electrical receptacles may include light switches and outlets. The examples given below specifically refer to GFCI outlets but the principles described are not limited to GFCI outlets and may be used in any of a variety of active cover plate and electrical receptacle configurations. There are several illustrative examples of nomenclature that can be used to describe the relationship of various elements to each other. FIGS. 2A, 2B, and 2C show one example of an illustrative coordinate system that can be used to define directions for the active cover plate. The three orthogonal axes are labeled "long." for longitudinal, "lat." for lateral, and "trans." for transverse. FIG. 2D shows additional nomenclature that defines the direction "outboard" as being away from the centerline of the active cover plate and "inboard" as being toward the centerline of the cover plate.

FIG. 2A shows a front view of one embodiment of a GFCI active cover plate 28 (e.g., an active cover plate 28 suitable for use with one or more GFCI outlets 10). The GFCI active cover plate 28 may have a number of apertures 30, including one or more screw apertures 30a and one or more aperture(s) 30b through which a GFCI outlet 10 and/or buttons 14 (e.g. FIG. 1A) thereof may be accessed.

FIGS. 2B and 2C are front and rear perspective views, respectively, that show prongs 32 extending rearward (in the transverse direction) from a front plate 34 of an active cover plate 28. The front plate 34 includes a front surface 31 and a back surface 33. In some examples, a base of the prongs 32 may be sandwiched between a back plate 36 on an active cover plate 28 and a front plate 34 thereof. The back plate 36 and/or front plate 34 may include a number of additional features, including additional posts 38 that can be used to secure the back plate 36 to the front plate 34 and/or to secure different prongs 32 for connection to ordinary outlets.

FIG. 2D shows a rear view of the GFCI active cover plate 28 with the prongs 32 extending rearward from the rear surface 33 of the front plate 34. The prongs 32 may be secured to the front plate 34 in a variety of ways. For example, the base of the prongs 32 may fit over one or more of the posts 38 and may be sandwiched between the front plate 34 and the backplate 36. The prongs 32 are lower on the front plate 34 for the GFCI active cover plate 28 than on a standard outlet active cover plate because of the lower placement of the screw terminals 24 on the GFCI outlet 10. The two opposing prongs 32 may contact either the load or the line screw terminals 24 of a GFCI outlet 10, depending on the configuration of the specific GFCI outlet 10 and installation orientation of the active cover plate 28 with respect to the GFCI outlet 10. As discussed above, if the prongs 32 contact the line screw terminals 24, an active cover plate 28 may draw electrical power from the house wiring 12 and may operate regardless of whether the GFCI outlet 10 is tripped. If the prongs 32 contact the load screw terminals 24, an active cover plate 28 may not have power when the GFCI outlet 10 is tripped.

FIG. 2E shows a side view of an active cover plate 28. From the side, the structure of the GFCI prongs 32 shows that the prongs may be generally straight and extend from the front plate 34 in a perpendicular manner. However, this is only one example. The prongs 32 may have a variety of other configurations. For example, the prongs 32 may extend from the front plate 34 at any angle, including angles that bring the tips of the prongs 32 toward each other.

FIG. 2F shows a bottom view of an active cover plate 28 and prongs 32 that extend rearward off the front plate 34. The prongs 32 may include back element(s) 40, a main ramp 42 at the terminal end of the prongs 32, and front element(s) 44. In some embodiments, the back element(s) 40 and front element(s) may be insulative components. In this example, a free/terminal end of a resilient contact (near the base of a prong 32) may be sandwiched between a front element 44 and a rear element 40. The terminal end of the resilient contact may slide between these two insulative components 40, 44 to facilitate the compression of the contact as the corresponding prong 32 is inserted in the gap 20 between the edge of the GFCI outlet 10 and the outlet box 22 and its subsequent re-expansion to contact the screw 24.

As shown in FIG. 2F, each of the prongs 32 may include a resilient contact 46 (in this illustrative embodiment the resilient contact can be described as a resilient bowed contact) and an auxiliary spring 48 (e.g. a cantilevered spring) beneath the resilient contact 46. The resilient contact 46 may compress during insertion of the prongs 32 between the body of the GFCI outlet 10 and sides of the electrical receptacle box 22. This results in a prong 32 that can pass through very thin/narrow openings/gaps. The contact 46 then expands/rebounds when the prong 32 reaches the recessed area containing the screw terminals 24 or other area with greater width.

The spring 48 may assist the contact 46 in expanding by providing additional force on the rear of the resilient contact 46. This may assist in bringing the contact 46 inward, increasing the width of the prong 32, and makes an electrical connection between the contact 46 and the screw terminal 24. The spring 48 may or may not be present in a particular design. In general, the contact 46 may contain sufficient resilient force to rebound after compression.

Figure 2G:
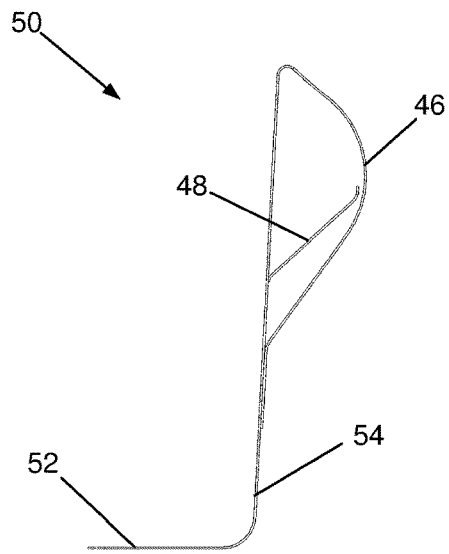
Figure 2H:
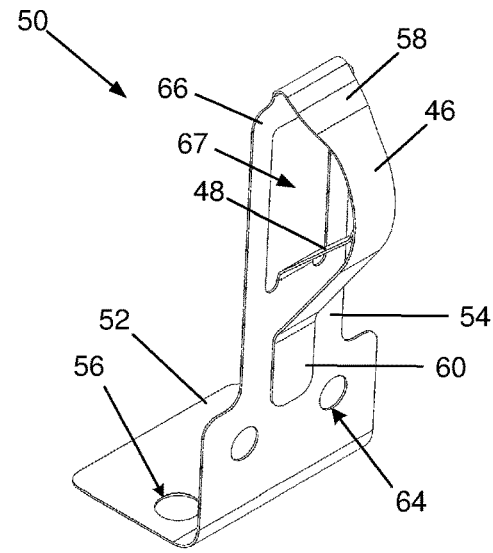
Figure 2I:
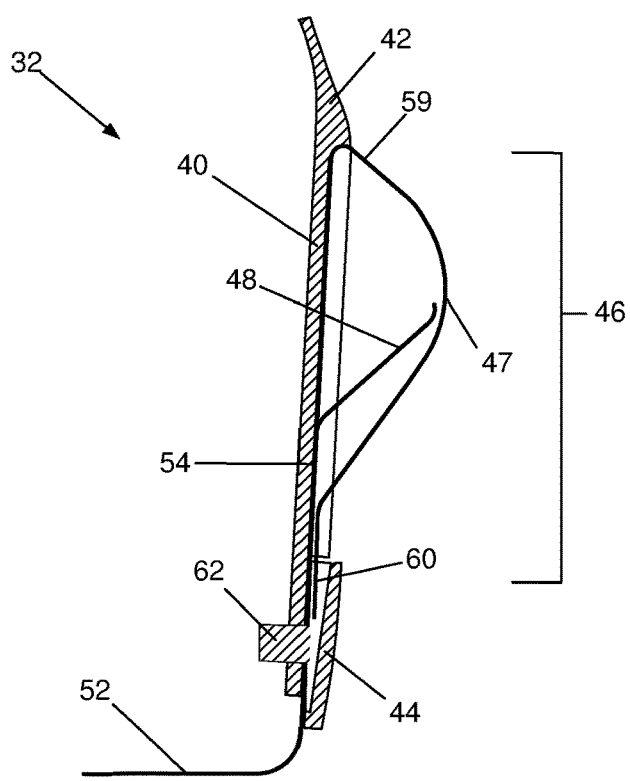

FIGS. 2G, 2H, and 2I show one embodiment of a metal clip 50 that can be incorporated into a prong 32 and may be configured to provide resilience, electrical conductivity, and a contact 46 for a prong 32. FIG. 2G is a side view of the metal clip 50, showing the base 52, upright 54, and resilient contact 46. The spring 48 is also shown. FIG. 2H shows a perspective view of the metal clip 50. In this example, the base 52 of the metal clip 50 has apertures 56 that are configured to fit over posts 38 that extend from the rear of the front plate 34. The metal clip 50 may also include a number of other features. For example, there may be another cutout or aperture 67. The resilient contact 46 may extend over this aperture 67 with a first fixed end 59 (FIG. 2I) on one side of the aperture and a second free end 60 on the other side of the aperture. In some embodiments, the aperture 67 may be generally rectangular and pass entirely through the upright. This aperture 67 may be behind the resilient contact 46. This aperture 67 may have a first short side, a second short side, and a first long side and a second long side. The first fixed end 59 may be proximate to the first short side of the aperture and the free end 60 may be proximate to the second short side. The base 52 may also be secured by sandwiching it between the front plate 34 and the back plate 36.

The upright portion 54 is configured to support the prong 32 and resiliently flex when forces are applied to the prong. For example, the flexure in the upright 54 may be configured to allow the prongs 32 to bend outward when placed over an electrical receptacle 10 that is wider than spacing between the two opposing resilient contacts 46. The flexure and resiliency in the upright 54 then urges the prong 32 inward so that the contact 46 is brought into electrical and mechanical contact with the screw terminal 24 of the GFCI outlet receptacle 10. The upright 54 may or may not be metal or conductive. In some embodiments, the upright may be formed from plastic or other material.

The contact 46 of the metal clip 50 may be formed by bending an extension 58 from the top of the upright 54 into a desired shape. For an example of an unbent prong with an extension 58, see FIG. 9A. In this example, the extension 58 is bent near its base and the extension 58 curves to form the rounded resilient contact 46 and place the end 60 of the extension 58 against a lower portion upright 54. As discussed elsewhere in the present paper, in this embodiment, the end 60 can be configured to slide back and forth against the upright 54 as the curvature of the contact 46 changes, thereby increasing/decreasing the overall width of the prong 32.

Thus, the prong 32 may be connected to the back surface 33 of the front plate 34 at a location outboard of the outlet aperture 30 and extend rearward away from the back surface 33 of the front plate 34 in the transverse direction. The prong 32 may include an upright 54 extending rearward away from the back surface 33 of the front plate 34 in the transverse direction and a resilient contact 46 located on an inboard side of the upright 54.

FIG. 2I shows an insulating back element 40 and an insulating front element 44 over a metal clip 50. The outboard/back element 40 covers the rear of the metal clip 50 and the top curve of the resilient contact 46. The front element 44 covers the bottom/end 60 of the extension 58 and has two posts 62 that extend through corresponding apertures 64 in the upright 54 and apertures in the back element 40. These posts 62 may be compressed to secure the back and front elements 40, 44 in place on the metal clip 50. The rear element 40 may also be secured by having shoulders 66 on the metal clip 50 slide into slots in the rear element 40. In this example, the rear element 40 includes a ramp 42. Both the front and rear elements in this example may be insulating.

Thus, as illustrated in FIG. 2I, a resilient contact 46 may include a first end 59, second end 60, and middle portion 47. The first end 59 and second end 60 may contact the upright 54 while the middle portion 47 extends inboard and away from the upright 54. One of more of the ends 59, 60 may be free to move with respect to the upright 54. In the example shown in FIG. 2I, the first end 59 is connected to the upright 54 and the second end 60 is free to move with respect to the upright 54. In other prong embodiments shown below, the prongs may have other configurations, with both ends of the contact being free to move or the end of the contact extending farthest away from the base of the prong may be free to move instead of the end closer to the base.

In some embodiments, the prong 32 may further include a front element 44 covering at least a portion of the inboard side of the upright 54. The second end 60 of the contact 46 may be captured between the front element 44 and the inboard side of the upright 54 such that the second end 60 has a greater freedom of motion in the transverse direction than in the lateral direction or the longitudinal direction.

The examples discussed above are only illustrative. The principles described may take a variety of different forms and be combined with other principles or features described herein. For example, the prongs 32 and/or metal clips 50 described in FIGS. 2J and 2K may have different geometric implementations than other prongs than incorporate the principles described herein. For other examples of prongs with different geometries see FIGS. 5, 6, 7, 8, 9, 10, 11. The prongs 32 are not limited to any specific embodiment shown, but can have a wide range of implementations of the principles described.

As discussed above, various models of GFCI outlets 10 may have different setback distances 26 from the mount. Consequently, the prongs 32 extending rearward from the front plate 34 of an active cover plate 28 may have various lengths or contact configurations to contact a wider range of GFCI outlets 10. One approach to contacting screw terminals 24 with different setback distances 26 is to make prongs 32 with two different heights 68.

Figure 2J:
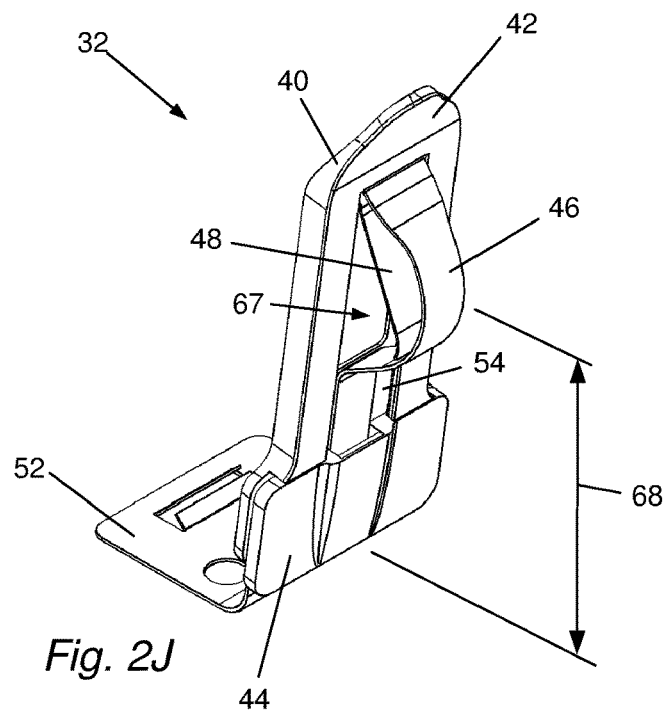
Figure 2K:
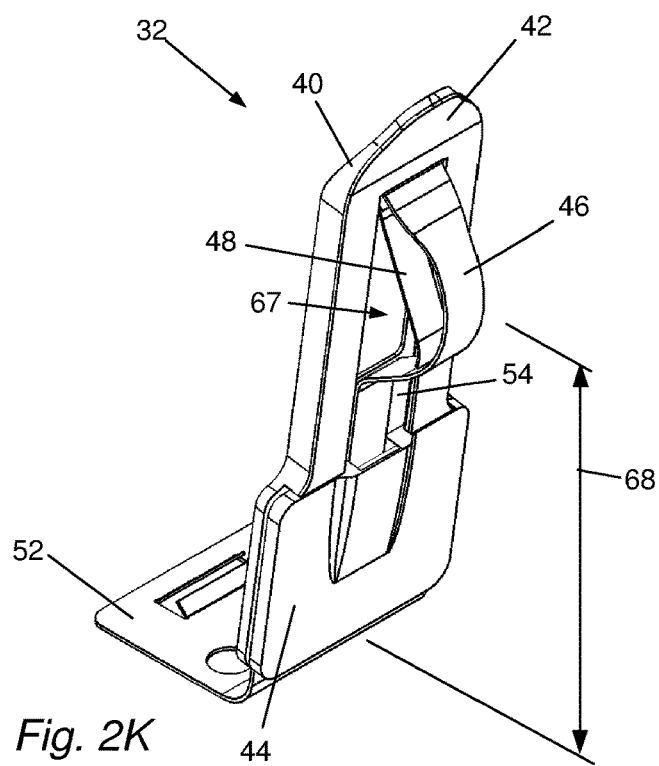

If a particular GFCI outlet 10 has screws 24 that are set back farther than other GFCI outlets 10, a taller prong 32 may be used to reach farther into the GFCI electrical outlet receptacle box 22 to reach the screw terminal 24. FIG. 2J shows a shorter GFCI prong 32. FIG. 2K shows a longer GFCI prong 32. Also shown in FIGS. 2J and 2K are cantilever springs 48 that extend from an upper portion of an upright 54 rather than from a lower portion of an upright 54 as shown in FIGS. 2B, 2C, 2F, and 2G-2I.

FIGS. 2J and 2K also show the resilient contacts 46, the uprights 54, the insulation including the front element(s) 44 and rear/back element 40 with terminal ramps 42. The bases 52 may include a number of features to retain the prong on the face plate and to make an electrical connection with circuitry that is included in the active cover plate. For example, conductive material may connect the resilient contact to the electronic circuitry. In this example wires may connect to the base of the prong and then to a circuit board sandwiched between the front plate and back plate. However, the prongs, circuitry and the method of connecting the circuitry to the prongs may vary in other embodiments. For example, the prong may have an integral extension of metal that connects to the circuit. Additionally or alternatively, the resilient contact may be conductive while other elements, such as the upright 54 may not be conductive. A wire or other conductive element may connect directly to the contact and the circuit. In some embodiments, the circuitry may include a light source such as LEDs.

Figure 3A:
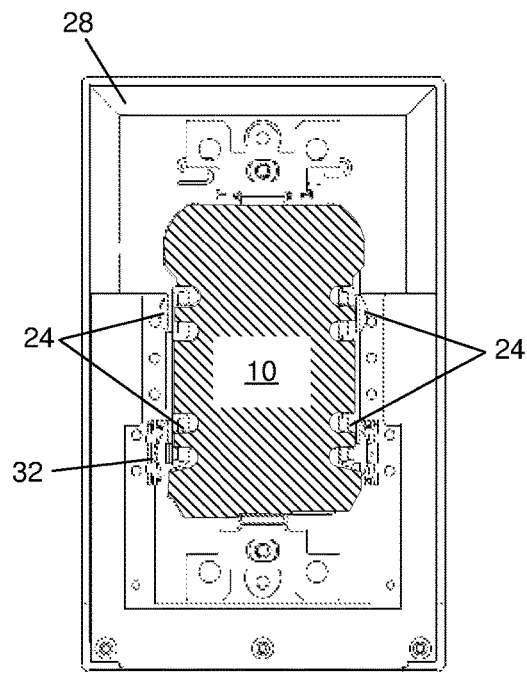
FIG. 3A-3C are illustrations of a GFCI active cover plate installed over a GFCI outlet, according to one example of principles described herein.
Figure 3B:
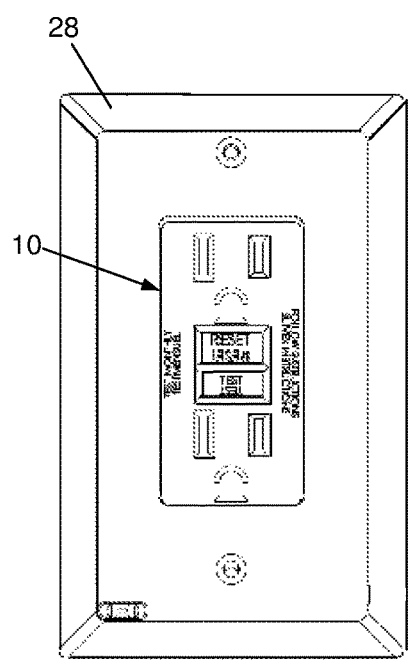
Figure 3C:
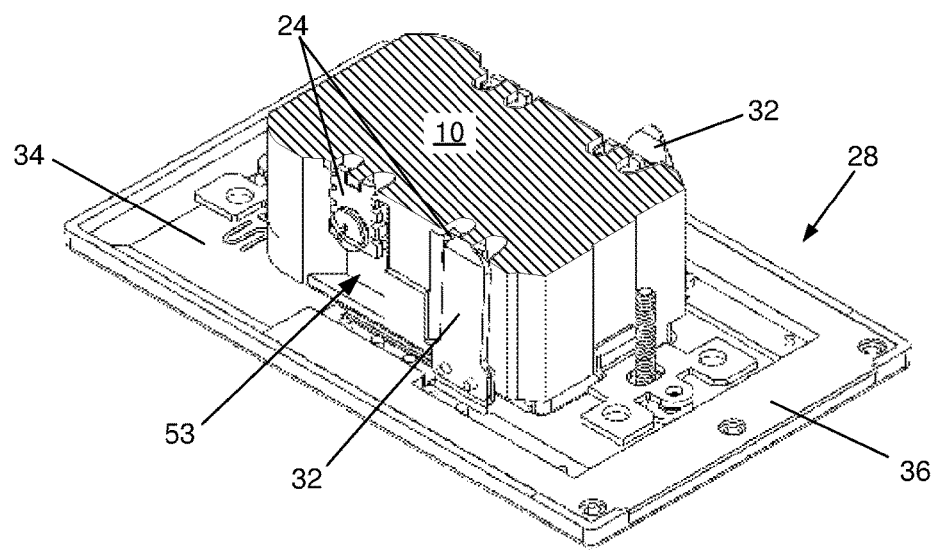

FIG. 3A shows a rear view of a GFCI outlet 10 with an active cover plate 28 installed over the GFCI outlet 10. FIG. 3B shows a front view of the GFCI outlet 10 with the active cover plate 28 installed. FIG. 3C is a rear perspective view that shows a prong 32 extending along the side of the GFCI outlet 10, which enables a corresponding resilient contact 46 to extend into recesses 53 and contact an inset screw terminal 24.

In one example, an active cover plate 28 may include at least one prong 32 configured to contact a screw terminal 24 of an electrical receptacle 10 such as a GFCI outlet or other receptacle. This prong 32 may include a front element 44 that may serve as insulator and/or bottom cover on the inboard side of prong 32 and back element 40 on the outboard side of the upright 54. The back element may have a number of functions including insulation, structural support, or other functions. The prong 32 also may include a resilient contact 46 (e.g. a bowed or resilient contact) extending beyond the front element 44 (e.g. bottom cover) to make contact with the screw terminal 24 of an electrical receptacle 10. The active cover plate 28 may include a circuit and an electrical connection between the at least one prong 32 and the circuit, wherein the at least one prong 32 may supply the circuit with electrical power from the screw terminal 24.

In one example, the resilient contact 46 (e.g. bowed contact) may compress under a normal or lateral force of less than ten newtons to less than one quarter of its uncompressed height. The resilient contact 46 may also be secured between the front element 44 (e.g. insulating and/or bottom cover) and the back element 40 (e.g. insulating cover). Additionally or alternatively, the resilient contact 46 may be configured to compress to less than half of its uncompressed height.

For example, the resilient contact 46 may be configured to be compressed to less than half of its uncompressed height under manual pressure during installation of the active cover plate 28 over an electrical receptacle 10. In some embodiments, the resilient contact 46 may be configured to rebound to at least 80% of its original height after being compress to half of its uncompressed height.

Figure 4A:
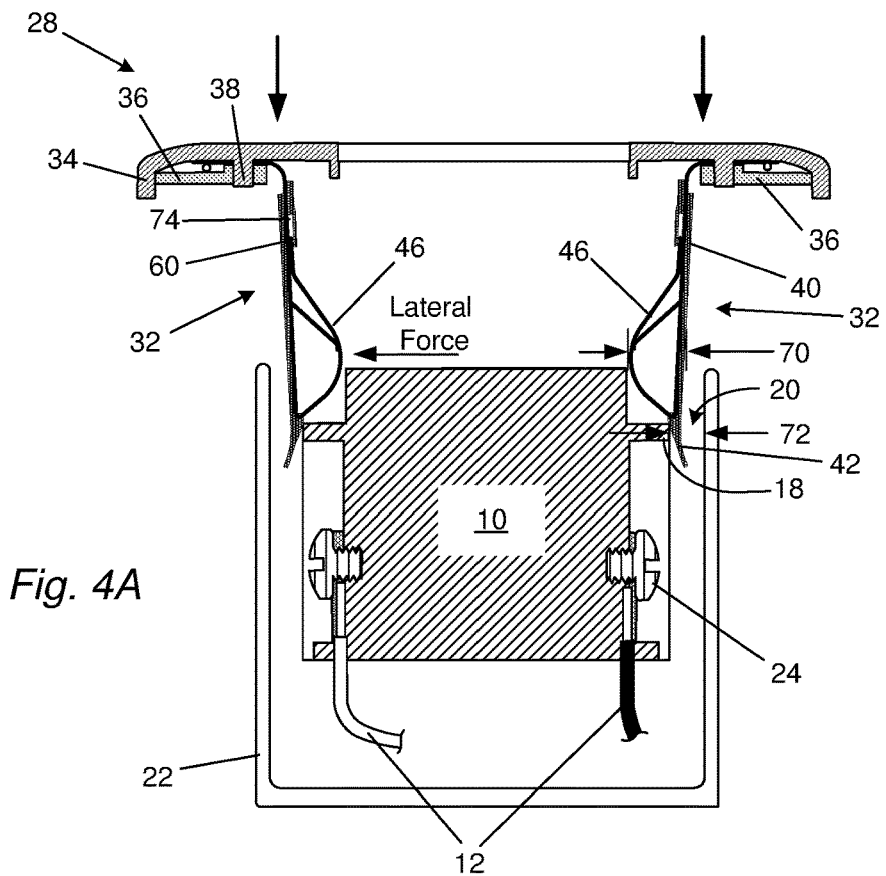
FIGS. 4A-4D are diagrams showing installation of a GFCI active cover plate over a GFCI outlet, according to one embodiment of principles described herein.

FIGS. 4A-4D are diagrams that show various illustrative stages of an installation and removal of an active cover plate 28 over a GFCI outlet 10. In FIG. 4A the active cover plate 28 with its prongs 32 extending rearward has been placed over the GFCI outlet 10 so that there is one prong 32 on either side of the GFCI outlet 10. The prongs 32 in this example are secured between the front plate 34 and back plate 36 with posts 38 extending through the base of the prongs 32. Electrical power to the GFCI outlet 10 is supplied through wires 12 that are connected by screw terminals 24.

As shown, the width 70 of the prong 32 exceeds the width 72 of the narrow gap 20 between the body of the GFCI outlet 10 and the electrical box 22. In this case a shoulder 18 on the GFCI outlet 10 protrudes to create the narrowest portion of the gap 20. In this embodiment, the prong 32 must compress to pass through the gap 20. However, in other embodiments the prong 32 may flex or contract to pass through the gap 20.

In this embodiment, the prongs 32 also include a main ramp 42 that is configured to engage with the body of the GFCI outlet 10 and guide the prongs 32 around the GFCI outlet 10. However, in other designs, the ramp 42 may be configured to engage with the electrical box 22 and have an incline in the other direction. For example, the prongs 32 in FIGS. 2J and 2K have ramps that are inclined in the opposite direction of those shown in FIGS. 4A-4D. Before the contacts 46 begin to enter the gap 20, the end 60 of the contact 46 does not extend all the way into the cavity 74 between the outboard insulation/rear element 40 and the inboard insulation/front element 44. This leaves space in the cavity 74.

Figure 4B:
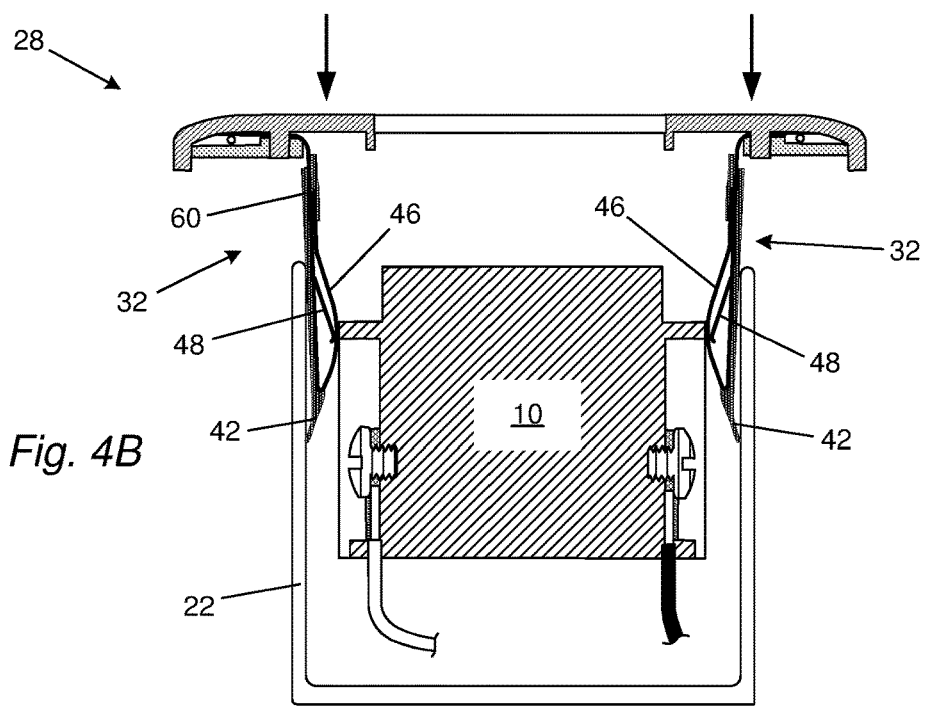

FIG. 4B shows the active cover plate 28 being installed over the GFCI outlet 10 and the prongs 32 compressing to enter the narrow gap 20. The free end 60 of the contact 46 extends into the cavity 74, FIG. 4A and allows the face/profile of the contact 46 to straighten, thereby narrowing the overall width 70 of the prong 32. The auxiliary spring 48 also bends, thereby allowing the overall width 70 of the prong 32 to narrow. Also, the back of the prong 32 is in contact with the inner wall of the electrical box 22. In this example, the main ramp 42 is in contact with the inner wall of the electrical box 22 as well.

Figure 4C:
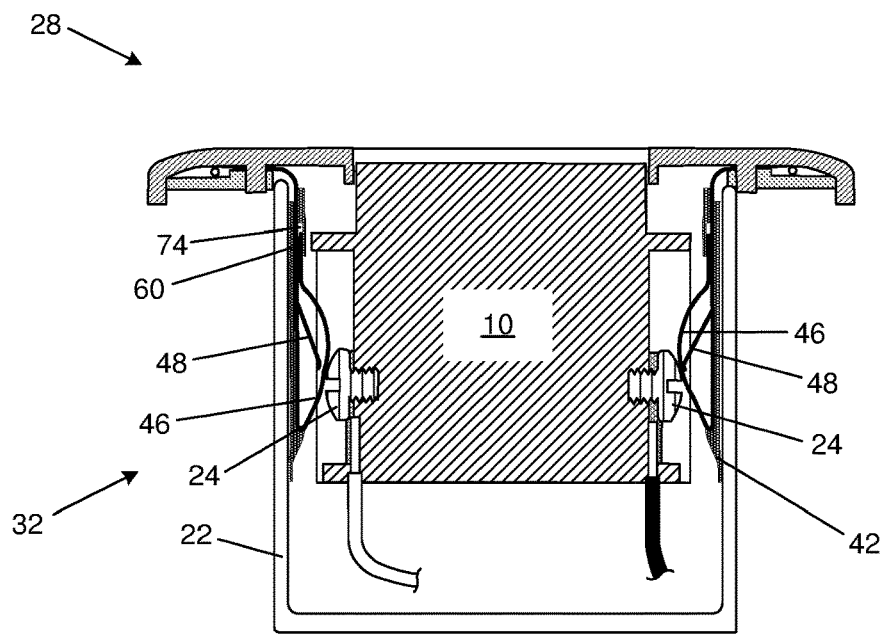
Figure 4D:
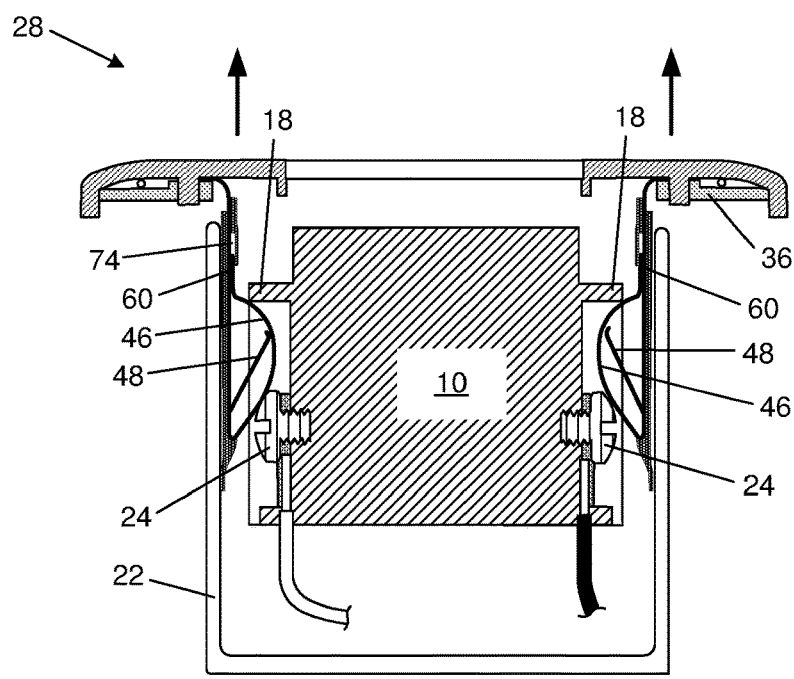

FIG. 4C shows the active cover plate 28 in place over the GFCI outlet 10 and the free end 60 of the contact 46 retracting out of the cavity 74 and the contact 46 rebounding/recovering its width 70 after passing through the gap 20 to contact the screw terminal 24. The auxiliary spring 48 may provide some portion of the recovery force to assist the contact 46 in recovering. However, there are embodiments of the GFCI prongs 32 that do not include the auxiliary spring 48 or the auxiliary spring 48 may have a different geometry. For example, the auxiliary spring 48 may be a cantilever spring as shown in FIG. 4C or may have a different geometry as shown in FIG. 4D. The prong 32 may also have a variety of other auxiliary spring 48 types, sizes, and/or geometries that assist with rebound of the contact 46. For example, a compression spring may be under the contact 46 or may otherwise support the contact 46. In some embodiments, the front of the prong 32 may be in contact with the screw terminal 24 and at least a portion of the outboard side of the prong may be in contact with the inner wall of the box 22. For example, the ramp 42 and/or other portions of the prong may be in contact with the electrical box 22.

FIG. 4D shows removal of the active cover plate 28 from the GFCI outlet 10. In this configuration, friction between the contact 46 and the shoulder 18 of the GFCI outlet 10 may tend to prevent contact 46 from being withdrawn. In some embodiments, this may tend to pull the terminal end 60 of the contact 46 out of the cavity 74 and to bunch up the contact 46 rather than having it collapse and narrow to pass through the gap 20. To mitigate this, the free end 60 of the contact 46 may be captured in the cavity 74 to prevent the end 60 of the contact 46 from being pulled from the cavity 74 during removal of the active cover plate 28. This concept is described in greater detail in FIGS. 5G-5I and associated text. The auxiliary spring 48 may have an additional purpose in that it may prevent the contact 46 from bunching up as the active cover plate is withdrawn.

As discussed above with respect to FIGS. 4A-4D, a first end 59 of the resilient contact 46 may be secured with respect to the rear element 40 (e.g. insulating cover) and a second end 60 of the resilient contact 46 may be configured to slide with respect to the rear element 40. The second end 60 of the resilient contact 46 may be configured to slide between the rear element 40 and the front element 44. The second end 60 of the resilient contact 46 may be configured to slide into a slot between the rear element 40 and the front element 44 when the contact 46 is compressed and to retract at least partway out of the slot when the contact 46 relaxes (see e.g. FIG. 4C). Additionally, the prong 32 may include an additional spring 48 configured to provide a restoring force to the resilient contact 46 to restore the height of the resilient contact 46 after compression. The spring 48 may be a cantilever spring 48 or other appropriate spring 48 configured to press against an underside of the resilient contact 46.

Figure 5B:
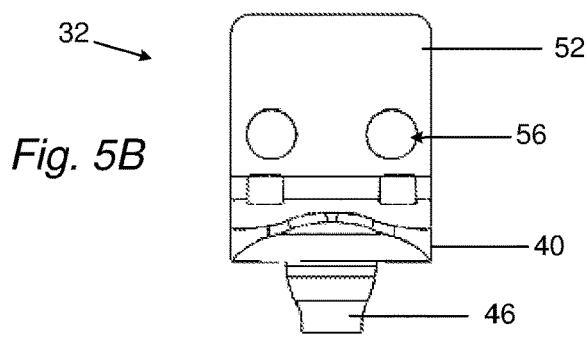
Figure 5A:
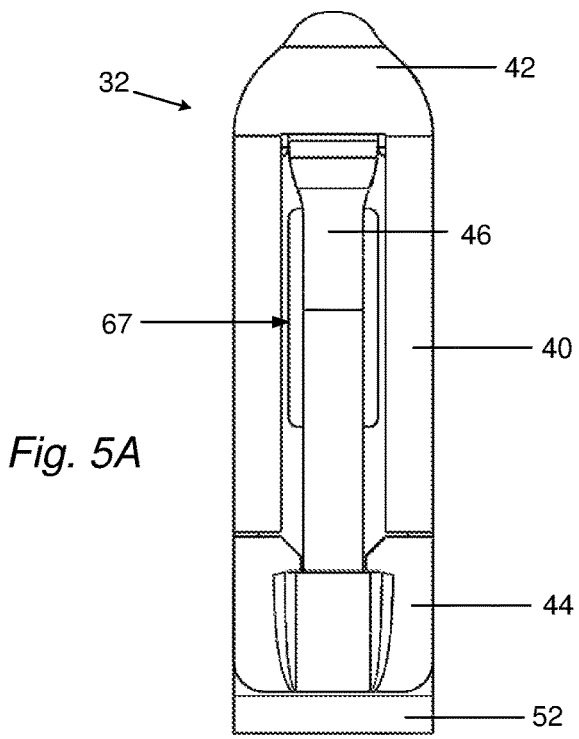

Prongs 32 in accordance with the present invention may have a number of features and benefits that are described with respect to FIGS. 5A-5F. FIG. 5A is a front view of a prong 32 showing the base 52, a bottom cover 44, a contact 46, a rear element 40, which acts as an insulating cover, extending upward from the base 52 and supporting the contact 46 and main ramp 42 extending from or as part of the rear element 40.

FIG. 5B is a top view of the prong 32 with the contact 46 extending/bowing outward from the insulating cover 40. The base 52 is shown with securing elements formed therein. In this example, the securing elements are apertures 56 that are configured to accept mounting posts such as mounting posts 38 shown in FIGS. 2D-2F.

Figure 5C:
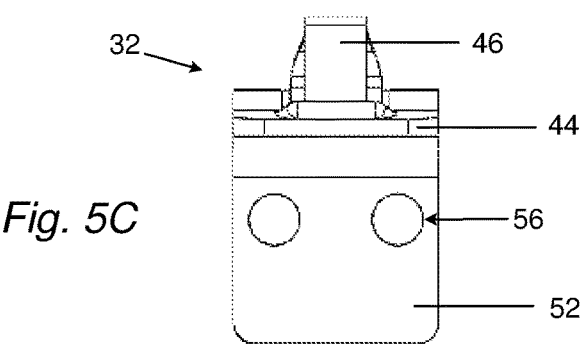

FIG. 5C shows a bottom view of the prong 32 with the contact 46, bottom/front cover 44 and base 52. As a force is applied (during insertion of the prong 32 between the GFCI outlet 10 and the receptacle box 22), the contact 46 may compress by sliding one end 60 further into the bottom cover 44. This allows the ends of the contact 46 to move away from each other and for the contact 46 to collapse or flatten. When the force is removed (i.e. the prong 32 reaches the side of the GFCI outlet 10 where the screw terminal 24 is located), the auxiliary spring 48 may assist the contact 46 in resiliently springing back to contact the often recessed screw terminal 24.

FIG. 5D shows a side view of a prong 32 that includes spring 48, contact 46 and base 52. In one embodiment, the base 52, spring 48 and contact 46 may all be stamped/formed from the same piece of resilient sheet metal. The bottom/terminal end 60 of the contact 46 may slide in a pocket, space, and/or cavity in the front element 44. This allows the bowed contact to compress to have a flatter profile. The front element 44 may be connected to the rear element 40 in this example by two joining posts 62. However, this and other connections could be made in a variety of different ways. FIG. 5E shows a rear view of the illustrative prong 32. FIG. 5F shows a perspective view of a prong 32.

Figure 5G:
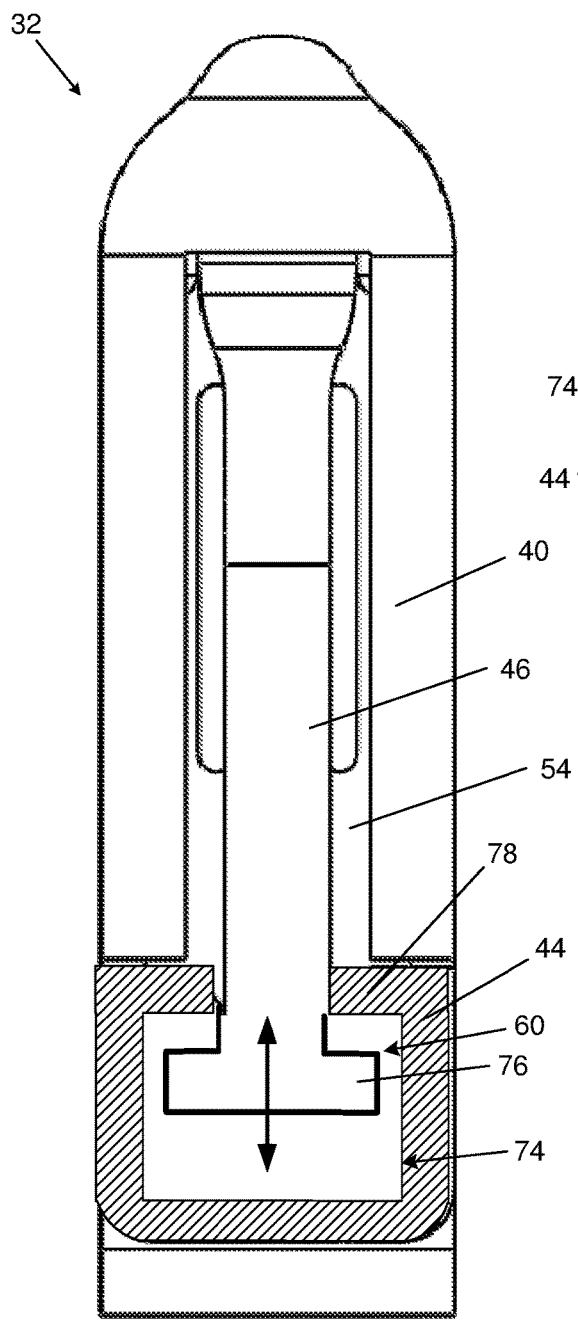
Figure 5H:
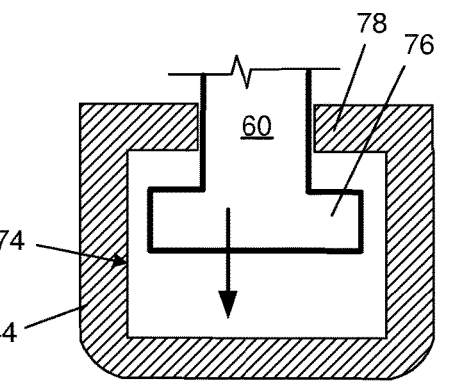
Figure 5I:
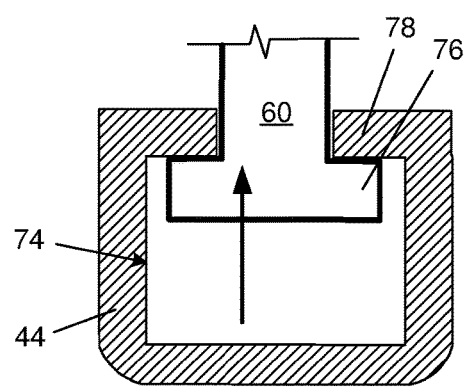

FIGS. 5G-5I show a prong 32 that includes end-capture of the contact 46. FIG. 5G shows a front view of the prong 32 with the front element 44 partially cut away to show the end 60 of the contact 46 captured within the cavity 74. FIG. 5H shows that during compression, the end 60 of the contact 46 extends further into the cavity 74 and during expansion of the contact 46 (i.e. retraction of the prong) the end 60 (e.g. a retention feature 76 of the end 60) contacts a blocking feature 78 to prevent the end 60 of the contact 46 from leaving the cavity 74. FIG. 5I shows that during expansion or retraction of the prong 32 the blocking feature 78 contacts the retention feature 76 and prevents the end 60 of the contact 46 from leaving or being pulled out of the cavity 74.

In some situations, there may be different GFCI outlet 10 configurations that have such different geometries that it could be difficult for a single prong 32 to contact the full range of GFCI outlets 10 and outlet configurations. For example, the GFCI outlet 10 may be installed upside down or right side up. If the screw terminals 24 are symmetrical, then the same prong 32 in the same position would contact the screw terminals 24 in both orientations. However, if the screw terminals 24 were not symmetrical about a midpoint of the outlet 10, then the prong 32 may not be able to contact the screw terminal 24 in one of the configurations.

Additionally, the GFCI outlets 10 may have screw terminals 24 at a range of depths. Some screw terminals 24 may be a shorter distance from the face of the outlet 10, while others may be a greater distance from the face of the outlet 10. Additionally, sometimes a GFCI cover plate is installed so that the front surface of the GFCI outlet 10 is flush with the front surface of the cover plate. In other situations, the GFCI outlet 10 may extend as much as a ¼ of an inch beyond the front surface of the active cover plate 28. This means that there may be variation of as much as a quarter inch in the depth or location of the screw terminal 24 with respect to the active cover plate 28 based solely on the way the GFCI outlet 10 is installed.

Figure 6A:
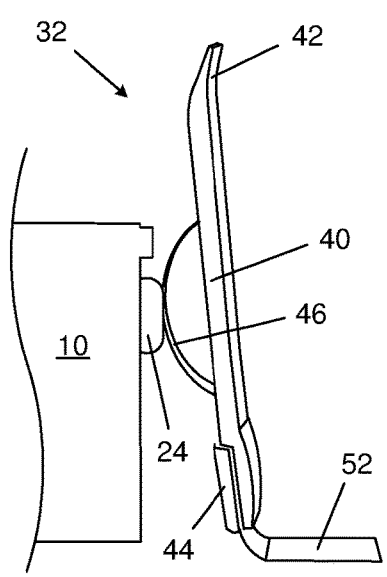
FIGS. 6A-6I are diagrams of illustrative GFCI prongs with adjustable contact positions, according to one example of principles described herein.

FIGS. 6A-6I are diagrams showing prongs 32 with contacts 46 that can be moved to better contact screw terminals 24 with varying depths. FIG. 6A shows a prong 32 with a contact 46 in a lower position. The contact 46 is touching some part of a screw terminal 24 (in this case a screw head of a GFCI outlet 10, although it could be touching any other electrified surface of any type of electrical receptacle).

Figure 6B:
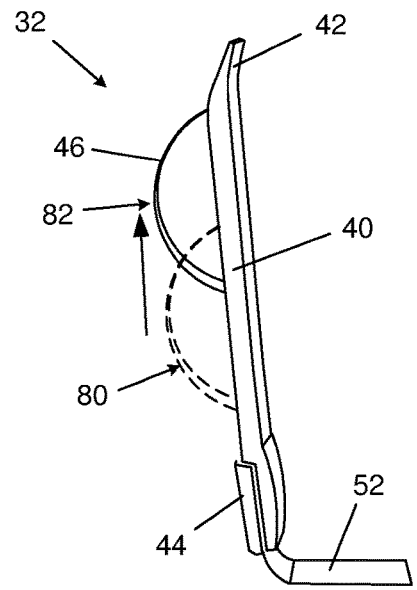
Figure 6C:
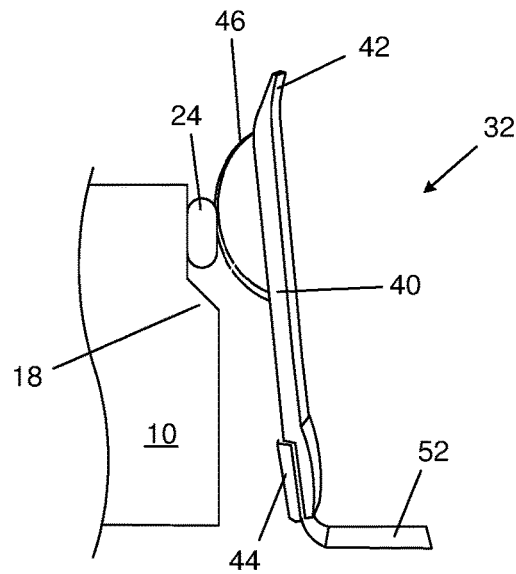

As discussed above it can be desirable for the same prong 32 to be configured to contact a wide range of electrical receptacles 10, including electrical receptacles 10 that have screw terminals 24 that are deeper into an electrical box 22 (i.e. see FIG. 6C where the recessed screw terminal 24 is farther from the base 52 of the prong 32). FIG. 6B shows that the contact 46 can be moved from one position 80 (for shallow terminals) to another position 82 (for deeper terminals). FIG. 6C shows the contact 46 in a position 82 suitable for contacting a recessed screw terminal 24 while avoiding a shoulder 18 of the GFCI outlet 10.

The prong 32 may be configured in a variety of ways to allow the contact 46 to be moved from one position 80 to another position 82. For example, the contact 46 may be a separate piece and "float" while still remaining captured. The contact 46 may be formed from metal and move up and down/in and out in a conductive track in the face of the prong 32. This may allow for motion of the contact 46 while still maintaining electrical conductivity between the contact 46 and other conductors in the prong 32.

Figure 6D:
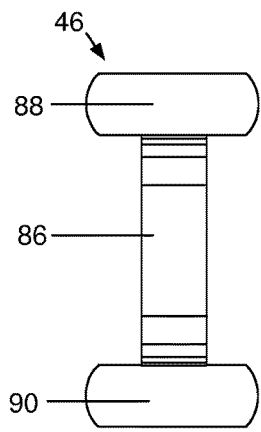

FIGS. 6D-6I show one embodiment of a mechanism that may allow a position of a contact 46 on the face 84 of a prong 32 to be adjusted. FIG. 6D shows an illustrative contact 46 and a prong face 84 that allow for the contact 46 to be moved and "locked" into place. In this example, the contact 46 may include a convex contact portion 86, an upper base 88 and a lower base 90. The contact 46 may be formed in a variety of ways and from a variety of materials. For example, the contact 46 may be formed from a conductive sheet and stamped into the desired shape/geometry.

Figure 6E:
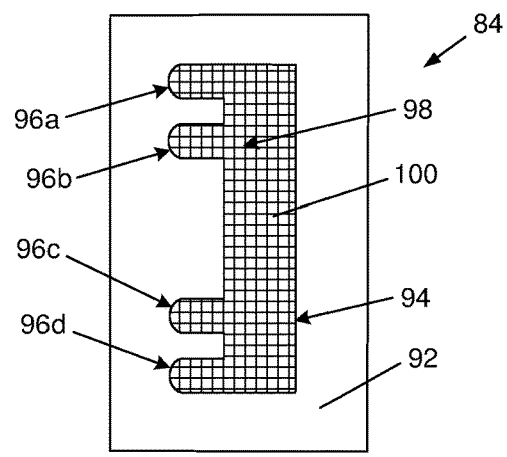

FIG. 6E shows a face 84 of a prong 32 that includes an outer layer 92 with an aperture 94. The aperture 94 may include four slots 96a, 96b, 96c, 96d spaced along one side 98, two upper slots 96a, 96c with the same spacing as the upper and lower bases 88, 90 of the contact 46 and two lower slots 96b, 96d, also with the same spacing as the upper and lower bases 88, 90 of the contact 46. The aperture 94 may be backed by an inner layer 100. The outer layer 92 (e.g., front insulation element 44) and inner layer 100 may be formed from a variety of materials including conductive and nonconductive materials. In one example, both the outer and inner layers 92, 100 are formed from conductive metal. In other embodiments the outer layer 92 is an insulator and the inner layer 100 is a conductor.

Figure 6F:
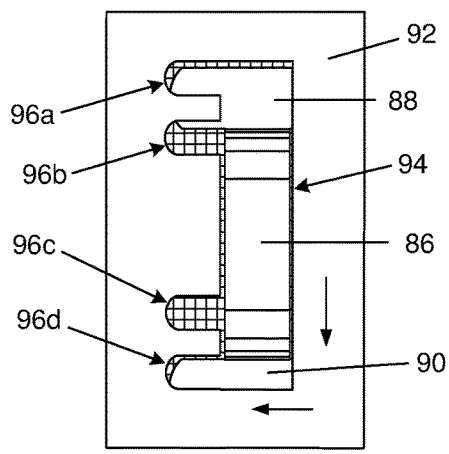

FIG. 6F shows the contact 46 in place in the face 84 of the prong 32, with the upper and lower bases 88, 90 sandwiched between the inner and outer layers 100, 92 and the convex contact portion 86 extending away from the face 84 of the prong 32 (toward the viewer). By moving the contact 46 down and to the left into the lower set of slots 96b, 96d, the contact 46 may be secured in a lower position 80, with the slots 96b, 96d preventing the contact 46 from moving vertically.

Figure 6H:
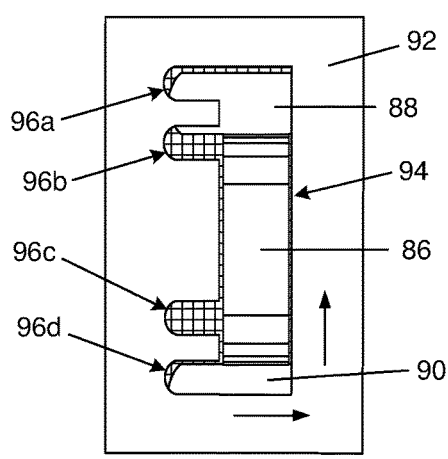
Figure 6G:
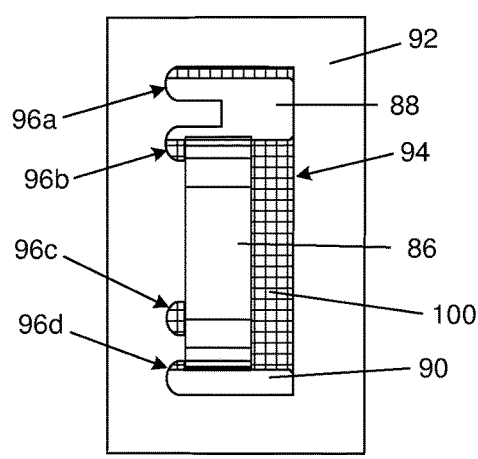
Figure 6I:
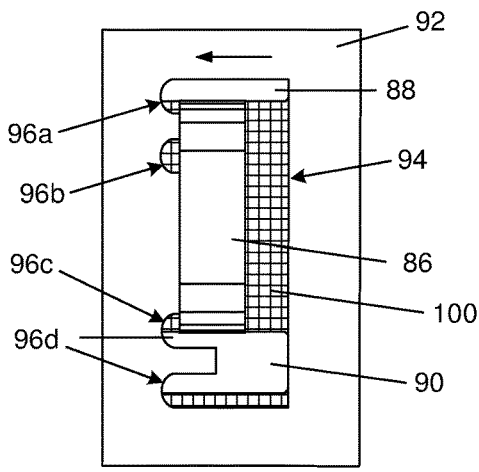

The upper and lower bases 88, 90 may be sandwiched between the inner and outer layers 100, 92 and are in electrical contact with at least one of the layers 92, 100 that is conductive. This allows for an electrical path from the contact 46 through the prong 32. FIG. 6G shows the contact 46 locked into position in the two lower slots 96b, 96d. However, the contact 46 may still be able to compress because one or more of the ends may be able to slide (e.g. in the slots 96b, 96d) to flatten an arch formed by the convex contact portion 86. Conversely, if the contact 46 is moved up and to the left as shown in FIG. 6H, the contact 46 may be locked or secured in an upper position 82 in the face 84 of the prong 32 as shown in FIG. 6I.

The description given above is only one example. There are many different embodiments of the contact 46 and prong 32 that could be used to make the position of a contact 46 adjustable on the face 84 of the prong 32. The principles described above can be combined with other principles, features, and descriptions in this document or documents that are incorporated by reference.

Figure 7A:
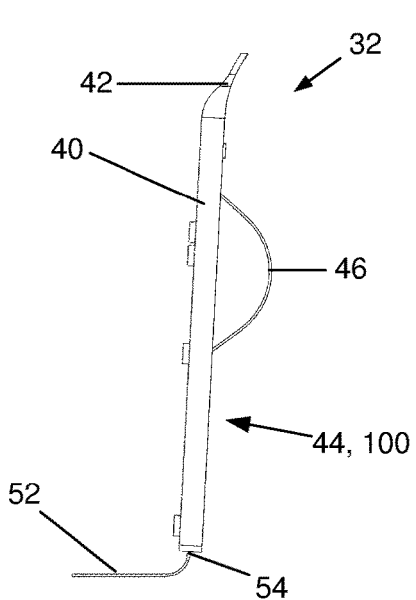
FIGS. 7A-7D are diagrams of illustrative GFCI prongs with adjustable contact positions, according to one example of principles described herein.
Figure 7B:
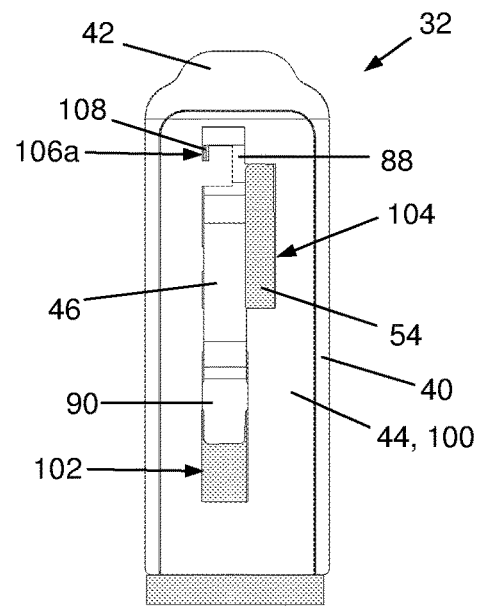
Figure 7C:
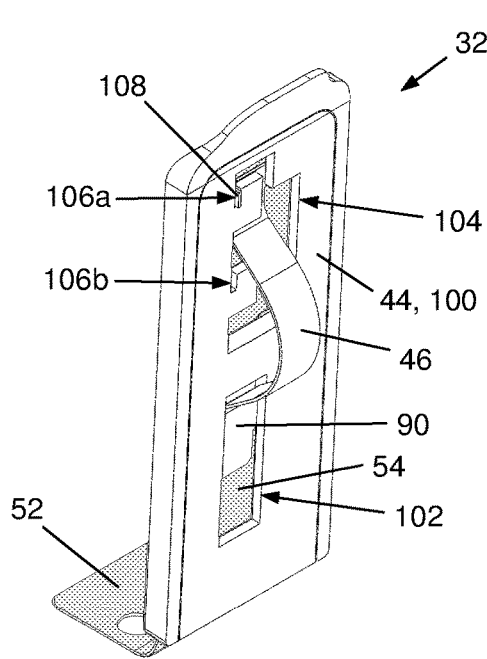
Figure 7D:
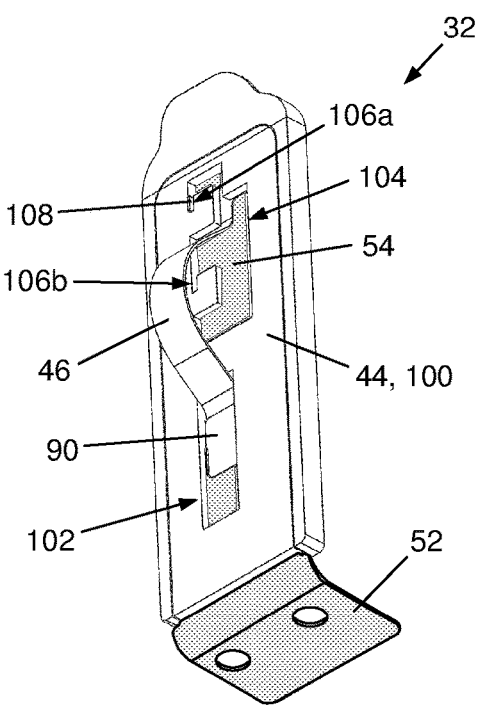

FIGS. 7A-7D show another illustrative embodiment of a prong 32 with a movable contact 46. FIG. 7A is a side view of the prong 32, showing the base 52 of the prong 32, an upright 54 extending at an angle from the base 52 and a ramp 42 at the distal end of the upright 54. A movable contact 46 extends from the inboard face 84 of the prong 32. FIG. 7B is a front view (of the inboard side of the prong 32) that shows the resilient contact 46 and the upright 54 at least partially covered by insulative material 40, 44. FIG. 7C is an upper perspective view of the prong 32 and FIG. 7D is a lower perspective view of the prong 32.

In this embodiment, the contact 46 has a lower base 90 and upper base 88 that are captured between an outer layer 92 (e.g., front insulation 44) and an upright 54. The lower base 90 may slide vertically within a lower aperture 102 or slot 102 in the outer layer 92. The upper base 88 may also slide within an upper aperture 104 in the outer layer 92. However, the upper aperture 104 in the outer layer 92 may have a number of locking features 106a, 106b that are configured to secure the upper base 88 in at least two vertical positions.

By securing only the top of the contact 46 (the upper base 88), the bottom base 90 may be free to slide within the lower aperture 102 to allow the contact 46 to compress/flex to pass through restricted locations such as narrow gaps 20 between GFCI outlets 10 and electrical boxes 22. In one embodiment, the upper base 88 has a tooth 108 that selectively engages the locking features 106a, 106b of the upper aperture 104 in the outer layer 92. Accordingly, the tooth 108 may engage or reside within an upper locking feature 106a when the corresponding contact 46 is in a more distal position with respect to the base 52 and may engage or reside within a lower locking feature 106b when the corresponding contact 46 is in a more proximal position with respect to the base 52.

Figure 8A:
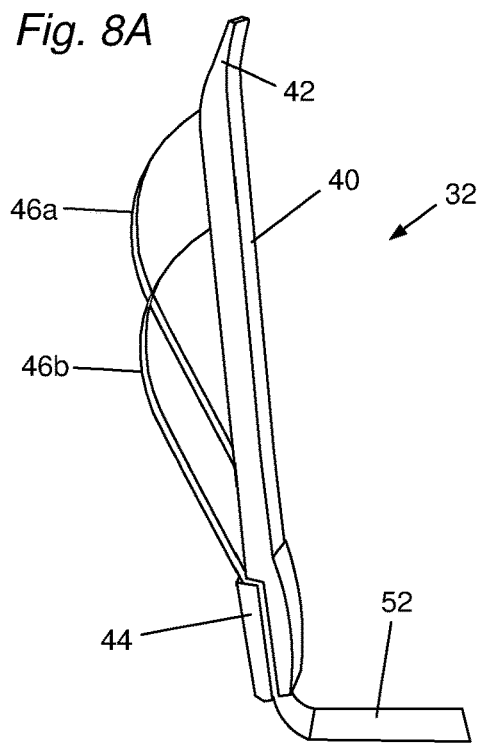
FIGS. 8A-8E are examples of illustrative GFCI prongs with dual contacts for a GFCI active cover plate, according to one example of principles described herein.

FIGS. 8A-8E show several illustrative examples of prongs 32 that have multiple contacts 46a, 46b to accommodate a wider range of variations in GFCI outlets 10. FIG. 8A is a side view of a prong 32 that includes an insulating rear element 40, a base 52, a front element 44, and two resilient contacts 46 (e.g., a first contact 46a and a second contact 46b). In this embodiment, the first and second resilient contacts 46a, 46b are bowed contact that slide in cavities 74 in the lower cover/front element 44.

Figure 8B:
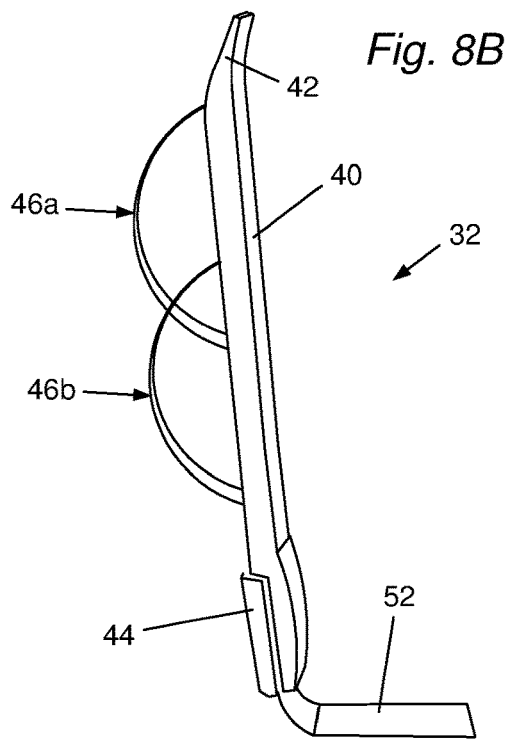
Figure 8C:
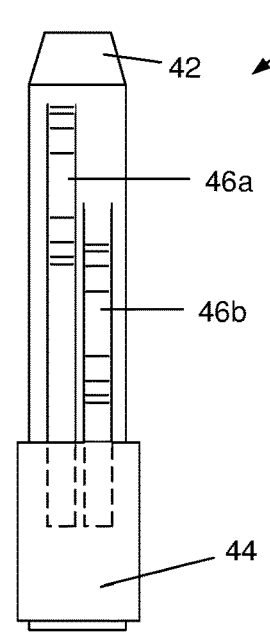
Figure 8D:
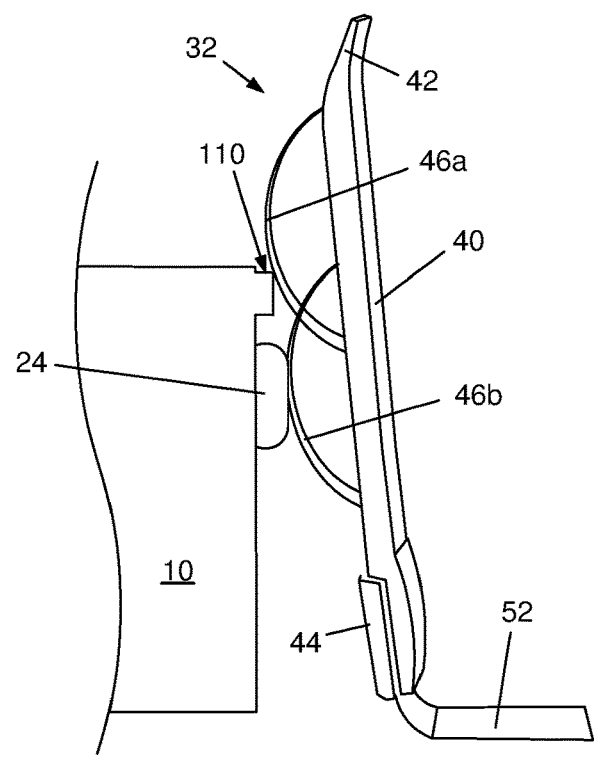

As shown in FIG. 8B, there are a number of shapes that the contacts 46 may have. In this figure, the contacts 46a, 46b are more rounded and protrude farther than the contacts 46a, 46b in FIG. 8A. FIG. 8C shows a front view of a prong 32, with the first contact 46a offset laterally and vertically from the second contact 46b. FIG. 8D shows a side view of a GFCI outlet 10 with an obstruction 110 above the screw.

Figure 8E:
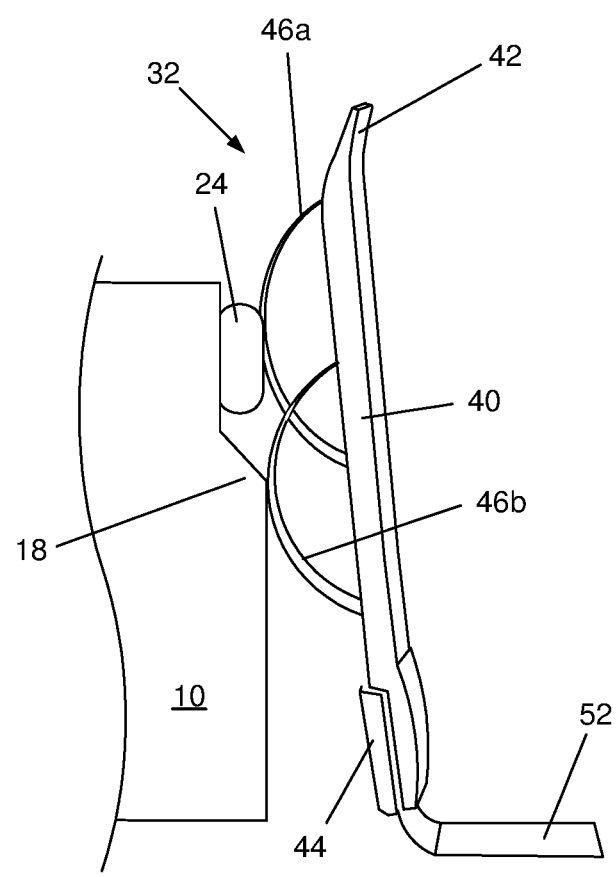

In selected applications or situations, a single contact 46 may encounter an obstruction 110 and be lifted away from the screw terminal 24. However, with prongs 32 having multiple independent contacts 46 (i.e. a first contact 46a and a second contact 46b) the first contact 46a may independently contact the obstruction 110 while the second contact 46b may contact the screw terminal 24. Conversely, if there is a shoulder 18 or other obstruction on the GFCI outlet 10 as shown in FIG. 6C and FIG. 8E, the second contact 46b may engage with the shoulder 18 while the first contact 46a may engage with a recessed screw 24. Thus, the independence of the two contacts 46a, 46b provides for greater compatibility with a wider range of GFCI outlets 10 and outlet configurations.

Figure 9A:
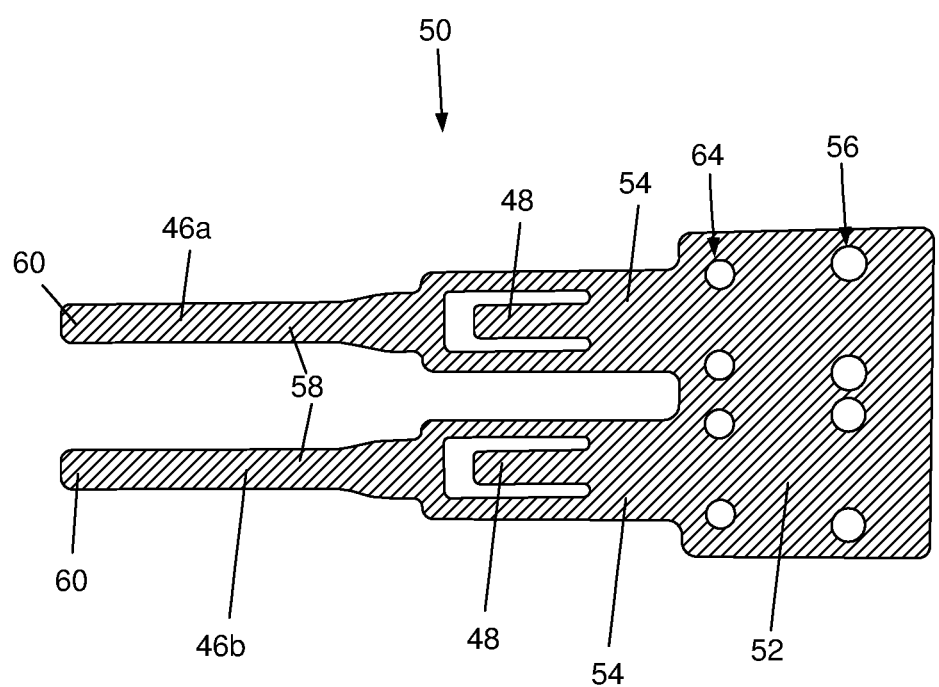
FIGS. 9A-9C are examples of illustrative dual GFCI prongs for a GFCI active cover plate, according to one example of principles described herein.
Figure 9B:
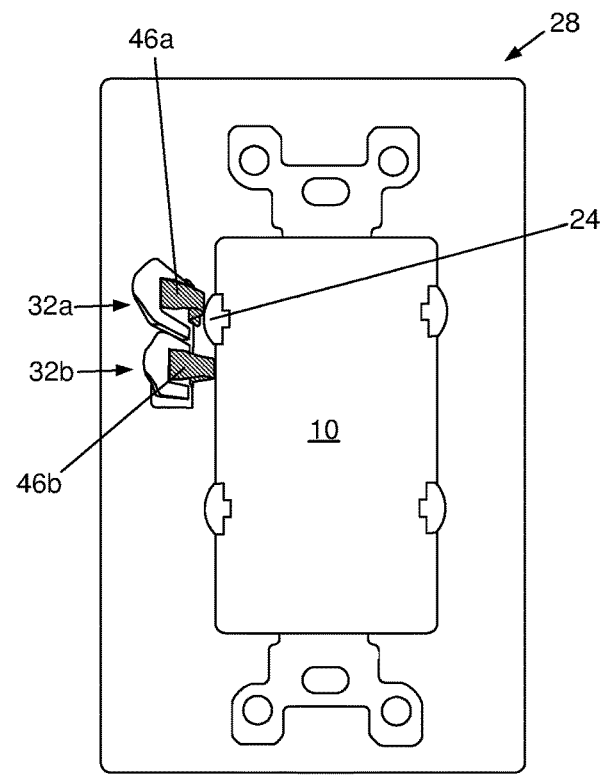
Figure 9C:
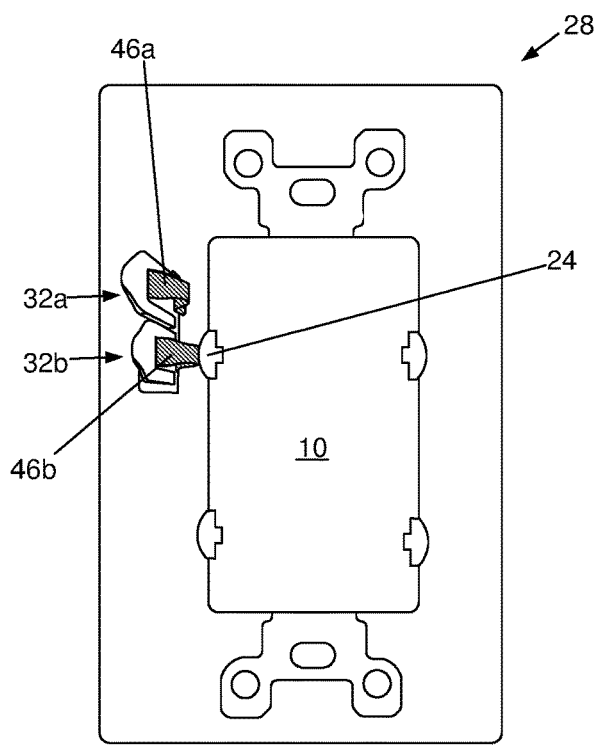

Thus, there may be one or more resilient contacts 46 (e.g. first and second contacts 46b, 46a as shown in FIGS. 8A-8E or dual contacts 46a, 46b corresponding to dual prongs 32a, 32b as shown in FIGS. 9A-9C). The first and second resilient contacts 46a, 46b may be vertically and laterally offset in the prong 32 (see e.g. FIGS. 8A-8E). In other examples, the first and second resilient contacts 46a, 46b may only be laterally offset in the prong 32 (see e.g. FIGS. 9A-9C and associated text). The first and second resilient contacts 46a, 46b may be only vertically offset in the prong 32, but not laterally offset. The first and second resilient contacts 46a, 46b may be able to compress independently. For example, one of the resilient contacts 46a, 46b may be configured to compress or reform dependent on the compression of the other contact 46b, 46a.

FIGS. 9A-9C show an alternative configuration with double prongs 32a, 32b. FIG. 9A shows a metal clip 50 suitable for use with double prongs 32a, 32b. The metal clip 50 may begin as stamped or otherwise cutout sheet metal that has not yet been bent or formed. The metal clip 50 may include a base 52 with apertures 56 to both receive mounting post 38 and apertures 64 through which the joining posts 62 can pass to secure insulating elements 40, 44. Extensions 58 are formed to make the contacts 46a and 46b and their free ends 60. The portions that form the upright 54 and cantilevered sprint 48 are also labeled.

FIG. 9B shows double prongs 32a, 32b forming part of an active cover plate 28 that is installed over a GFCI outlet 10. In FIG. 9B, the active cover plate 28 with double prongs 32a, 32b is installed over a GFCI outlet 10 with the GFCI outlet 10 in a "right side up" orientation. The active cover plate 28 is shown without the back plate 36, circuitry, or other prongs 32 (prongs 32 for engaging the other side of the GFCI outlet 10). The first contact 46a of the double prongs 32a, 32b is contacting the screw terminal 24, while the second contact 46b is not contacting the screw terminal.

FIG. 9C shows an active cover plate 28 with double prongs 32a, 32b installed over a GFCI outlet 10 with the GFCI outlet 10 in an "upside down" orientation. In this example, the GFCI outlet 10 is not symmetrical. Consequently, the second bowed contact 46b makes contact with the screw terminal 24 instead of the first bowed contact 46a. Thus the double prongs may increase the compatibility of the active cover plate 28 with a wider variety of outlets and outlet configurations.

In one example, an active cover plate includes at least one prong configured to contact a screw terminal of an electrical receptacle. The prong may include front electrical insulation on a first side of the prong, rear insulation on a second side of the prong; and a compressible contact extending beyond the front insulation to make contact with the screw terminal of an electrical receptacle. The active cover plate may also include a circuit and an electrical connection between at least one prong and the circuit. At least one prong may supply the circuit with electrical power from the screw terminal(s). The compressible contact may be secured between the front insulation and the rear insulation and a free end of the compressible contact may be configured to move with respect to the front and/or rear insulation. For example, the free end of the compressible contact may be configured to move in a cavity between the front insulation and rear insulation. In one embodiment, a first end of the compressible contact is secured with respect to the rear insulation and a second end of the compressible contact is configured to slide with respect to the rear and/or front insulation. For example, the second free end of the compressible may be configured to slide into a slot or cavity between the rear insulation and the front insulation when the contact is compressed and to retract at least partway out of the slot or cavity when the contact relaxes. The prong may include additional contacts. For example, the prong may include two or more compressible contacts that are horizontally or laterally offset from one another on the prong. These two or more compressible contacts may compress independently. In some embodiments, the contacts on the prong may not be compressible and there may be multiple contacts present on a single prong. For example, an active cover plate may include at least one prong extending rearward from the face plate. The prong may include multiple electrically conductive contacts. These contacts may be connected to each other using one or more fuse elements.

In one embodiment, an active cover plate may include a face plate, at least one prong extending rearward from the face plate. The prong may include an electrically conductive contact that includes a dielectric substrate with a plurality of electrically conductive patches supported by the dielectric substrate and connected to one another by one or more fuse elements.

FIGS. 10A-10G show various examples of principles or features that may be applied to prongs 32 for GFCI outlets 10 or other situations where prongs 32 need to pass through narrow openings and then expand to make electrical contact with elements beyond the narrow opening. FIG. 10A shows a resilient conductive plastic or metal prong 32 that may or may not be paired with an insulator (in this case a separate insulating wall 112) on the outboard side of the prong 32. The conductive prong 32 may have a fairly narrow profile and be flexible enough to compress to pass through a narrow opening.

FIG. 10B shows a flexible prong 32 with a rear element/insulator 40 coupled to its outboard side. For example, the flexible prong 32 may be formed by dual injection molding. First a conductive plastic may be injected to form the base 52, upright 54 and contact portions 46. The insulating plastic 40 on the upper and outboard sides of the conductive plastic could then be formed. Additionally or alternatively, the conductive plastic could be partially or completely replaced with flexible metal.

FIGS. 10C and 10D show a prong 32 that has an internal structure that expands after the active cover plate 28 is installed. For example, the prong 32 may include a base element 114 that is compressed as the active cover plate 28 is installed over the electrical receptacle 10. As the base element 114 is compressed, it may expand, broaden, alter the shape, or the like of a distal end of the prong 32 so that the prong 32 is brought into contact with the screw terminal 24. The front plate 34 and back plate 36 are shown in each of the embodiments.

FIG. 10E shows a prong with a spring or resilient joint 116 between the base 52 the upright 54. The spring or resilient joint 116 may urge the upright portion 54 of the prong 32 in an inboard direction 118 (toward the screw terminal 24 of an outlet 10). The profile of the upright 54 may be relatively narrow so that the prong 32 can extend into the narrow openings. After passing through the narrow opening the spring or resilient joint 116 may urge the contact 46 to the screw terminal 24. The conductivity of the prong 32 may be maintained through the spring or resilient joint 116.

FIG. 10F shows a prong 32 that includes an upright 54 that may or may not be conductive and an electrical contact 46 located on an upper/distal portion of the prong 32. The upright 54 may or may not be flexible and/or resilient. For example, the upright 54 may be made of a plastic material that may or may not be resilient or provide spring force. A conductor 120 may be connected to the contact 46 and pass into the internal space (e.g., to an electrical circuit) of the active cover plate 28.

FIG. 10G shows one embodiment where the electrical contact 46 is a magnet that is attached to a flexible upright 54. For example, the flexible upright 54 may be made of any material and have any of a number of different geometries. In one embodiment, the flexible upright 54 has a bending moment (stiffness, resistance to bending) that is small in one direction and significantly greater in another direction. For example, the magnet may be on the end of a sheet that can easily bend toward or away from the screw terminal 24, thereby allowing the magnetic force between the magnet and the screw terminal 24 to bring the magnet into contact with the screw terminal 24. In other dimensions or axes of rotation, the upright 54 may be more rigid to allow the magnet and corresponding prong 32 to be more accurately or easily maneuvered into position. For example, the upright 54 may be relatively rigid for motion that is in and out of the page. This would allow the upright 54 to support the weight of the magnet during installation of the active cover plate 28 over a wall mounted GFCI outlet 10.

Figures 11A, 11B:
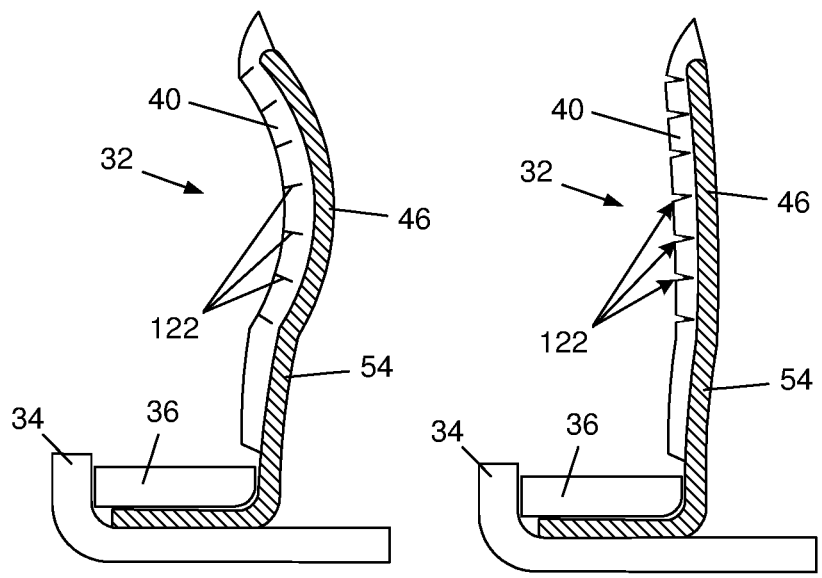
FIGS. 11A-11H show various illustrative examples of prongs for active cover plates, according to one example of principles described herein.

FIGS. 11A-11F are various illustrative embodiments of prongs 32 for active cover plates 28. FIGS. 11A and 11B show a prong 32 that includes an upright, conductive element 54 and a rear insulating element 40 that includes slots 122 or slits 122 to increase its flexibility. The upright, conductive element 54 may be any of a number of different elements, including conductive plastic or metal. It may be resilient and may or may not have its inboard side partially covered by insulation. It may have any shape that is appropriate. The slots 122 allow the thickness of the insulation 40 to be maintained while increasing the flexibility of the prong 32 overall.

Figures 11C, 11D:
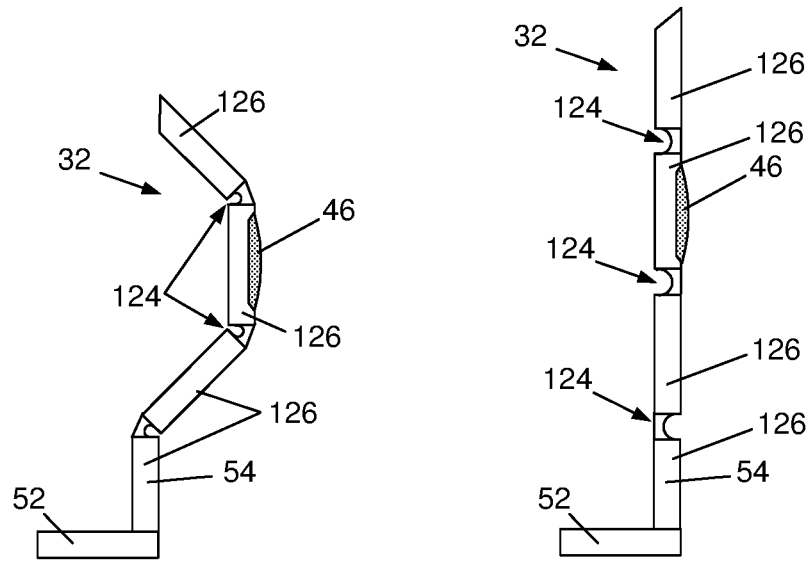
Figure 11E:
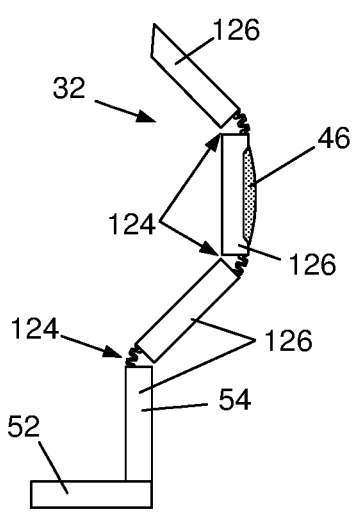
Figure 11F:
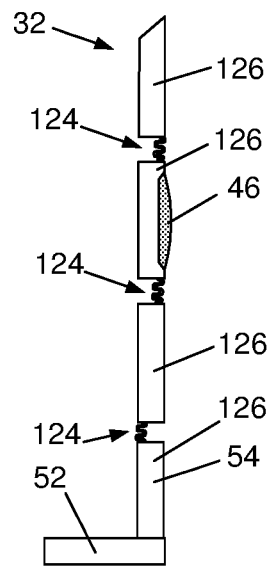

FIGS. 11C and 11D show prongs 32 comprising a number of joints 124 and stiffer segments 126 that work together to increase the flexibility and resilience of the prong 32. This embodiment and the following embodiment includes a base 52 and a segmented upright 54. FIG. 11C shows the prong 32 in its rest position with the contact 46 extending inward/inboard. During insertion or the application of forces that tend to straighten the prong 32, it straightens and elongates using the flexure provided by the joints 124. When the force(s) are removed, the prong 32 may return to its rest position to urge or initiate contact with the screw terminal 24 of the GFCI outlet 10. FIGS. 11E and 11F show an illustrative embodiment with different joints 124. In general, there could be any number of joints 124 in the prong and they could be located anywhere within the prongs 32 to facilitate the function of the prongs 32 and electrical contact between the contact(s) 46 and the screw terminals 24.

Figure 11G:
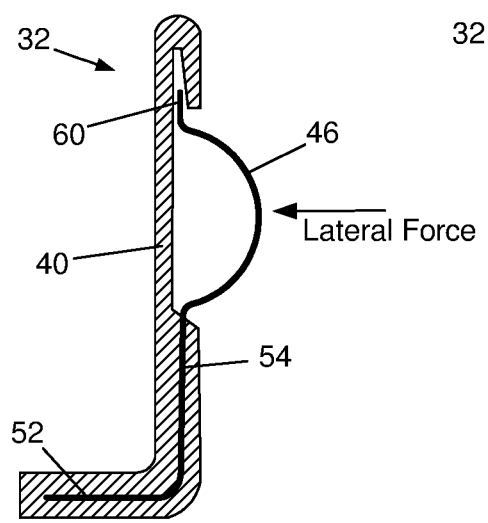
Figure 11H:
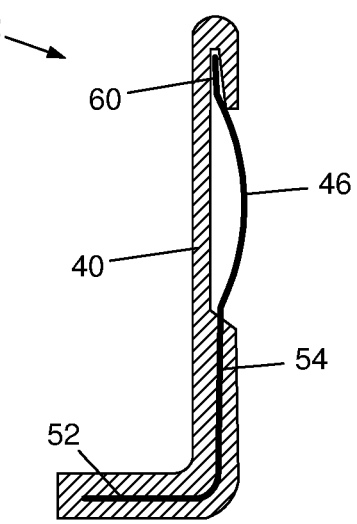

As used in the specification and appended claims, the term "free end" means free to move in at least one translational direction. For example, in FIG. 10B, the insulated end 60 of the contact 46 is a free end because it can extend or move in the transverse direction as shown in FIGS. 11A and 11B. Similarly, the prongs 32 shown in FIG. 11C-11F can extend or move in the transverse direction when forces are applied (compare for example FIGS. 11C and 11E with FIGS. 11D and 11F). The illustrative prongs 32 shown in FIGS. 2A-2K have a contact 46 with a free end 60 (see e.g. FIG. 2H) that can translate in the transverse plane that is generally parallel to the front of the upright 54. The free end 60 of the contact 46 may be on the far end of the contact 46 (relative to the base 52 of the prong 32) as shown in FIGS. 11G and 11H. Additionally or alternatively, the free end 60 may be on the near side of the contact 46 (relative to the base 52 of the prong 32) as shown in FIGS. 2A-2K. Further, both ends of the contact 46 may have limited freedom as shown in FIG. 6D-6I.

Figure 12:
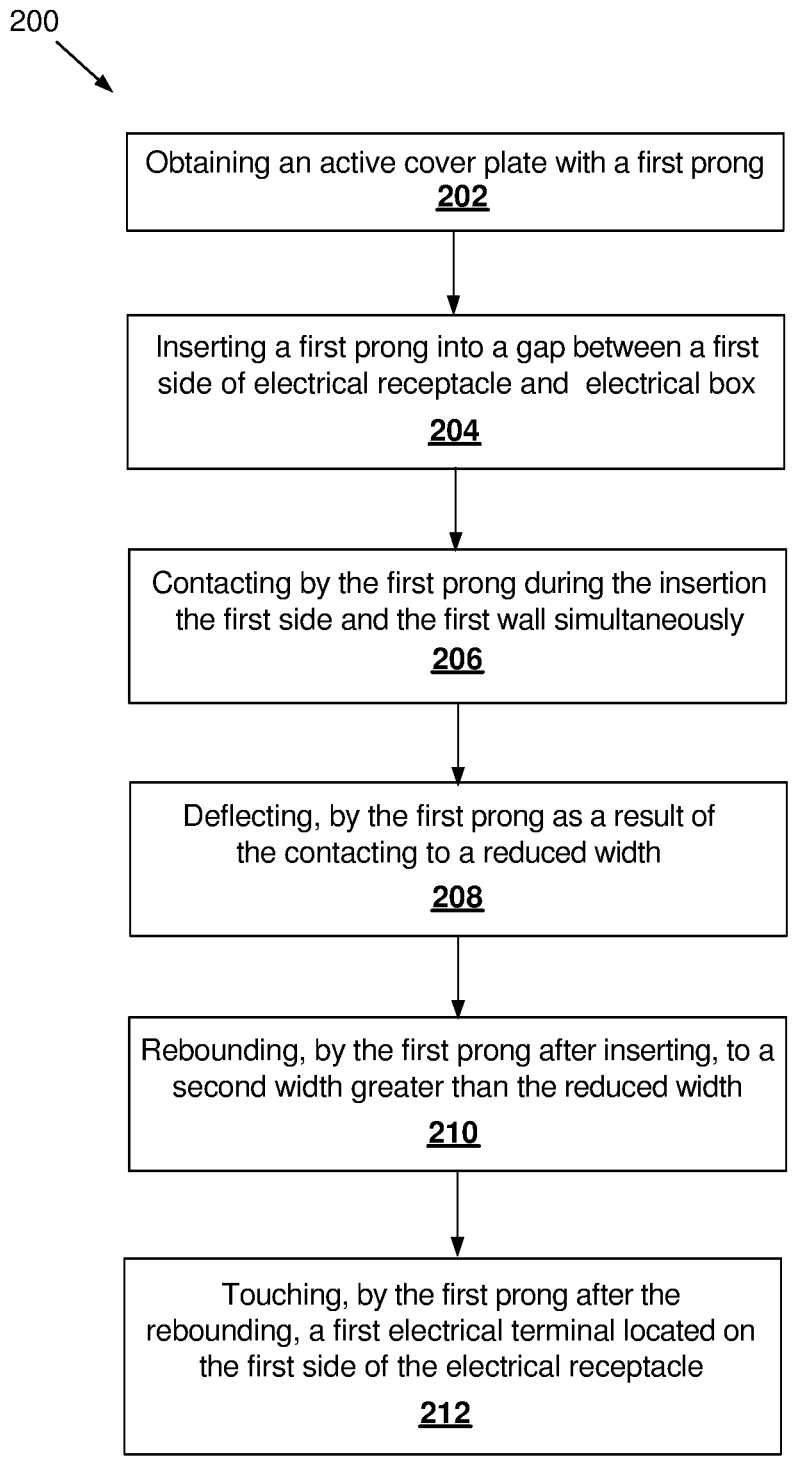
FIG. 12 shows an illustrative method for insertion of a prong of an active cover plate to touch an electrical terminal of an electrical receptacle, according to one embodiment of principles described herein.

In addition to the steps and description of principles described above, FIG. 12 shows an illustrative method 200 for insertion of a prong of an active cover plate to touch an electrical terminal of an electrical receptacle. The method includes obtaining an active cover plate with a first prong (step 202). The active cover plate may include a front plate and a first prong extending away from a backside of the front plate. The first prong is inserted into a first gap between a first side of an electrical receptacle and a first wall of an electrical box in which the electrical receptacle is installed (step 204). The method may also include contacting, by the first prong during the inserting, the first side and first wall simultaneously (step 206). As a result of the contacting, the first prong deflects to a reduced width (step 208). After inserting, the first prong may rebound to a second width greater than the reduced width (step 210). After rebounding the first prong may touch a first electrical terminal located on the first side of the electrical receptacle (step 212).

In some embodiments, the first prong may further comprise a first electrical contact, where the touching may include physical contact between the first electrical contact and the first electrical terminal. The active cover plate may further comprise electronic circuitry connected to the front plate and conductive material extending to connect the first electrical contact to the electronic circuitry.

Additionally, the active cover plate may include a second prong with a second electrical contact. In some embodiments, the inserting further comprises inserting the second prong into a second gap between a second side of the electrical receptacle and a second wall of the electrical box. The contacting may further include contacting, by the second prong during the inserting, the second side and the second wall simultaneously. The deflecting may further comprise deflecting by the second prong as a result of the contacting to the reduced width. The touching may further comprise touching, by the second prong after the rebounding, a second electrical terminal located on the second side of the electrical receptacle.

Figure 13A:
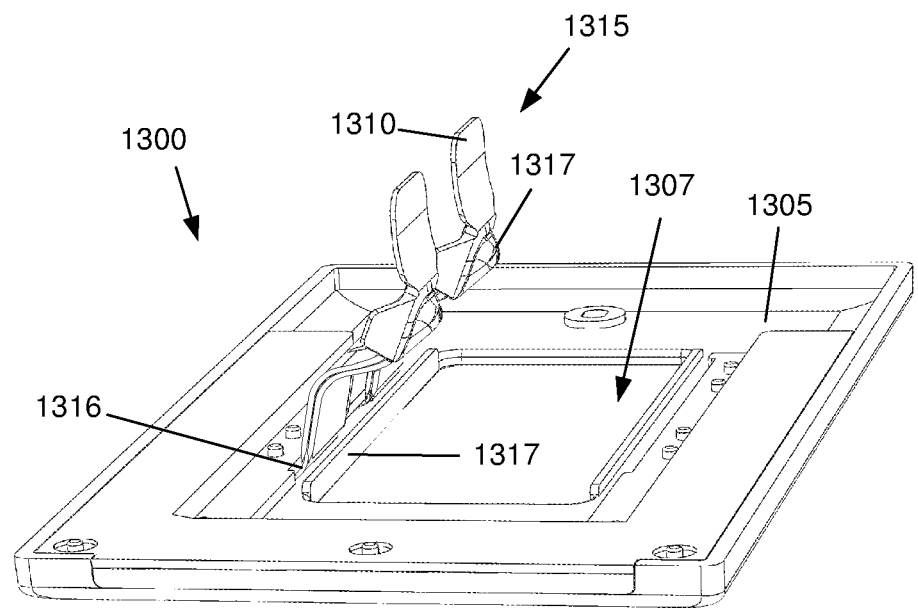
FIGS. 13A and 13B show one illustrative embodiment for insulating the inboard side of prongs, according to one example of principles described herein.
Figure 13B:
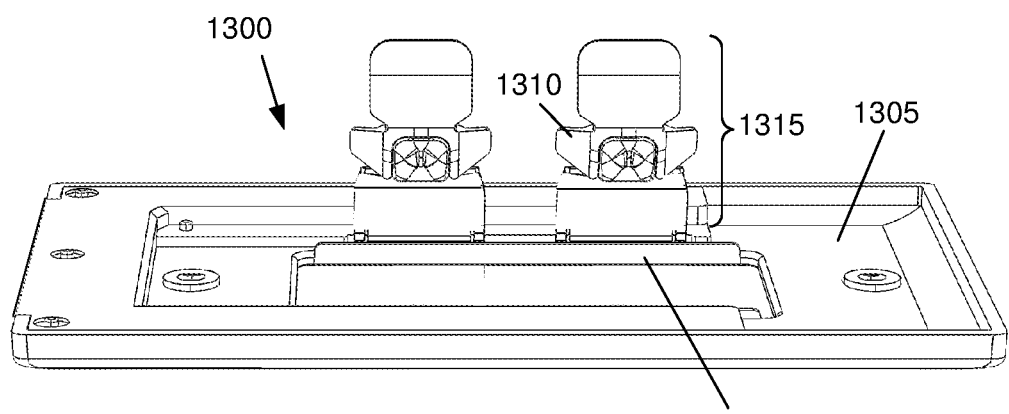

FIGS. 13A and 13B show rear perspective views of an illustrative two-prong active cover plate (1300) for use with a decor light switch. The principles described herein have wide applicability and can be used with a variety of different active cover plate and electrical receptacle designs. In this example, the active cover plate (1300) has a large aperture (1307) in the face plate (1305) to accommodate the rocker on the face of a rocker light switch.

In the illustrated embodiment, the two prongs (1315) are connected to the face plate (1305) and are configured to contact side screw terminals of a décor light switch. However, they will also contact screw terminals on many three-way and four-way light switches. But because there are only two prongs instead of three, four or more, complete electrical contact with all the screw terminals of three and four-way switches is not made. The two prongs extend rearward from the face plate and include both front and back insulation. The front insulation may be configured to insulate against electrical contact with the metal yoke of light switches and the rear insulation may be configured to insulate against electrical contact with electrical conductors in the electrical box.

The prongs (1315) also include a number of ramps surrounding the contact. As discussed previously, the ramps may allow the active cover plate (1300) to be installed more easily. The side ramps allow for vertical motion of the active cover plate (1300) to align the prongs (1315) with the screw terminals and the aperture in the face plate (1305) with the light switch toggle and/or rocker. The prongs (1315) can be inserted on the appropriate side of the light switch and then the active cover plate (1300) moved into place to align the aperture (1307) in the face plate (1305) of the cover plate with the toggle or rocker of the light switch.

As discussed above, prongs may have a number of different insulation configurations, including insulation/support that is integrally molded into the face plate. In one example, FIGS. 13A and 13B show various rear perspective views of an active cover plate (1300) that uses a protrusion (1317) molded into a rear surface of the face plate (1305) to insulate and/or support prongs (1315). In this example, the prong hood/insulation (1310) may leave a gap between the bottom of the insulation and the face plate. Consequently, this may leave some portion of the conductive material exposed. Additional insulation can be formed on the face plate. This is accomplished by molding a protrusion (1317) into the face plate (1305). In this embodiment, the protrusion (1317) extends upward/rearward to insulate a gap (1316) the otherwise exposed portion of the electrical conductor. In this example, the protrusion (1317) is an integrally molded feature in the face plate (1305) and the prongs (1315) fit onto the face plate (1305) such that the prongs (1315) are insulated on their inboard side by the protrusion (1317).

Thus, the active cover plate has front insulation that includes a protrusion on the face plate extending rearward to cover at least a portion of the inboard side of the prong. The protrusion on the face plate may cover a conductive metal portion of the prong. The conductive metal portion of the prong may include a formed metal sheet where the protrusion on the face plate may at least partially covers an inboard side of the bend of the formed metal sheet.

Figure 14A:
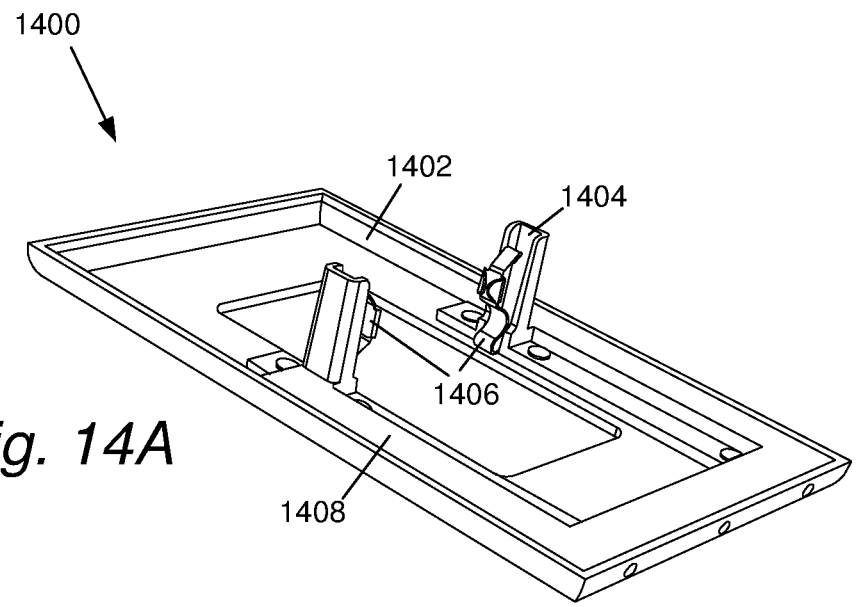
FIGS. 14A and 14B show various illustrative examples of prongs and insulation/support structures for active cover plates, according to one example of principles described herein.
Figure 14B:
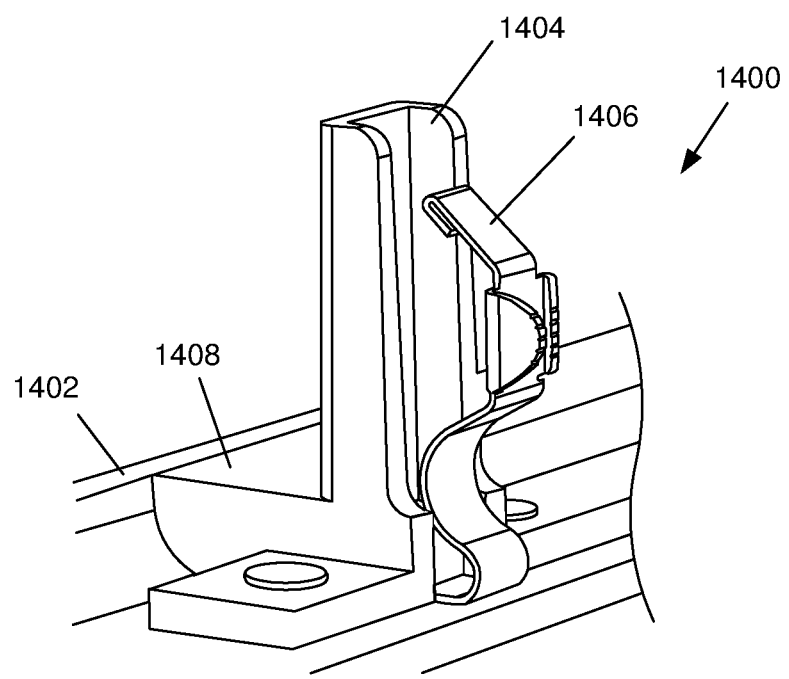

FIGS. 14A and 14B show an alternative embodiment of an active cover plate with spring clips that extract power from screw terminals on the sides of outlet or switch bodies. FIG. 14A shows a rear perspective view of an active cover plate (1400) that includes a face plate (1402), a sandwich or back plate (1408) with two integral "U" channels (1404) and spring clips (1406). This view illustrates that the U channel/rear insulation (1404) surrounds the rear and sides of the spring clips (1406) and prevents accidental contact with the spring clips (1406). The spring clips (1406) and rear insulation (1404) may have any of a variety of configurations and geometries, including those shown in other documents that are incorporated by reference. For example, the insulation of the rear and/or sides of the prong may take a variety of configurations, including a three-dimensional shape such as the "U" channel described above, a two dimensional shape, such as a wall (see e.g. 61/720,131, FIGS. 1B, 9E, 10B, 18, 39), a shape that the conductive elements fit or slide into (see e.g. 61/720,131, FIGS. 9C, 24, 42C; present disclosure, FIGS. 5A-5I, 15A-15E), or other appropriate geometry. The rear insulation may be an integral feature of the back plate or may be separate element.

FIG. 14B is a perspective view of the spring clip (1406). The spring clip (1406) includes a convex base curve, a concave mid curve, angled wings, an angled end portion, and a folded end. As discussed above, the angled end portion directs the spring clip (1406) outward as the active cover plate (1400) is initially brought into contact with the outlet or switch body. Folding the end of the spring clip (1406) creates a smooth end shape that is configured not to gouge or snag on surrounding materials.

The structure of the spring clip is designed to allow for large amounts of flexibility without permanent deformation. For example, the spring clip can be formed from a variety of different materials including copper, copper alloys, beryllium copper alloys, spring steels, beryllium alloys and other metal alloys. As discussed above, the spring clips are designed to make electrical contact with screw terminals on the sides of the outlet body. The screw terminals may have a variety of different widths, depending on the width of the outlet body and whether the screws are screwed out of the body or into the body. In one design, for small amounts of deformation, the spring clips primarily move outward by cantilever bending with most of the rotation occurring in and around the base curve. For larger amounts of deformation, the back portions of the spring clip can begin to contact the inner wall of the rear insulation. This changes the bending locations within the spring clips and prevents the base curve from being plastically deformed. The back portions that may contact the rear insulation include the back portion of the mid curve and the folded end of the prong. These portions are designed to slide within the rear insulation during deformation. For example, the rounded back portion of the mid curve and folded end both present smooth rounded surfaces that will slide easily in the rear insulation without becoming caught. The spring becomes much stiffer when the back of the mid curve and folded end contact the back of the rear insulation. The bending then occurs in different areas than the base curve. For example, a significant amount of the additional bending may occur in regions that are immediately above and below the angled wings.

The U channel provides a number of benefits as it interacts with the spring clip. It shields the screw terminal from accidental contact with exterior devices or components. The rear insulation also prevents undesirable plastic bending of the spring clip by supporting the spring clip. For example, when folded end of the spring clip is between the side walls of the rear insulation, lateral forces (for example forces exerted on the spring clip during vertical motion relative to the outlet body) may not bend the spring clip to the side because the spring clip will contact the side walls of the rear insulation.

Embodiments that use the U channel or other similar insulating shielding or tab may not require insulation placed directly on the spring clip. In the example shown in FIG. 14B, the spring clip does not have any insulating coating because it is protected and insulated from the surroundings by the rear insulation. In other embodiments, the rear insulation may be used in conjunction with an insulated spring clip or front insulation. The concepts described above can be broadly applied to prongs with a variety of geometries. For example, the concept of using rear insulation surrounding the prong on two or more sides can be applied with a wide range of prong and insulation geometries. This may accomplish a variety of purposes, including protecting and insulating the prong.

Figure 15A:
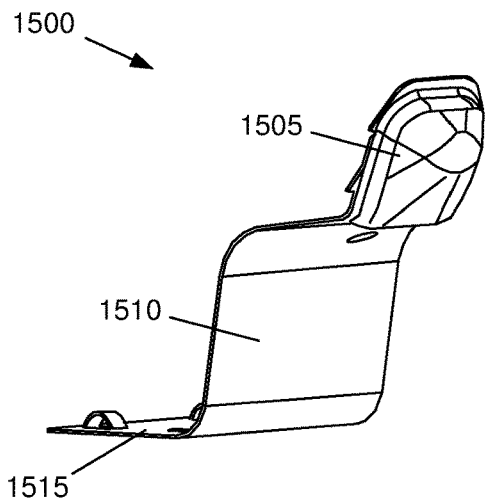
Figure 15B:
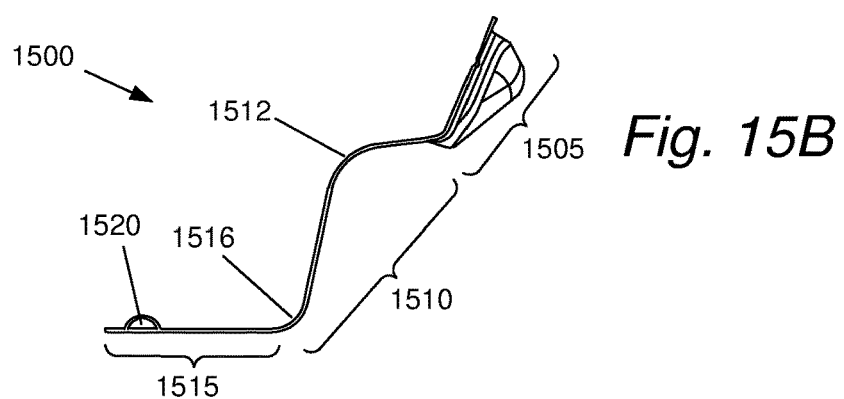

FIG. 15A shows a front perspective view of the conductive spring clip element (1500). The element includes a contact (1505) designed to make contact with a side screw terminal, a base (1515), and a curved flexure/flexible conductive element (1510) connecting the contact (1505) to the base (1515). FIG. 15B shows a side view of the conductive spring clip element (1500), with the contact (1505), curved flexure/flexible conductive element (1510), and base (1515). The curved flexure (1510) includes an elbow curve (1512) and a base curve (1516). The combination of these two curves may be configured to allow the element to bend around shoulders of light switches or outlet bodies. The base (1515) in this example shows a wire retention feature (1520).

Figure 15C:
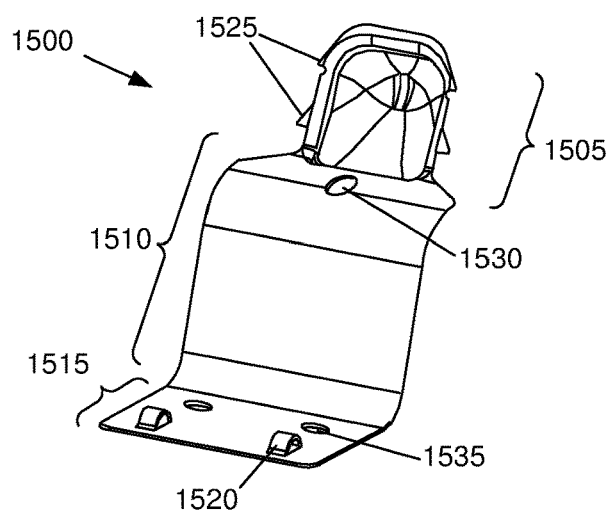

FIG. 15C shows a rear perspective view of the spring clip element (1500). This view shows barbed retention features (1525) along the sides of the contact (1505). The contact (1505) in this example is stamped out of the same piece of metal and is concave on the back side of the conductive element and convex on the front/inboard side (the side facing the screw terminal). The curved flexure (1510) also may include features to retain the insulating element. In this example, there is a hole (1530) through the curved flexure that allows a front portion and a rear portion of the insulating element to be connected together. The base (1515) may include wire retention features (1520) as discussed above and other retention features (1535) that assist in securing the base to the face plate. For example, the other retention features (1535) may include apertures configured to accept posts extending from the face plate. The features described above are only examples.

FIG. 15D shows various views of spring clips for use in guidelights for light switches. FIG. 15D is an exploded assembly view of one example of a spring clip. As discussed above, the spring clips include an insulating portion or hood (1540). The hood in this example is formed from a single piece of electrical insulating material and includes an upper portion (1590), a rear insulating portion (1555), and a front insulating portion (1570). The upper portion (1590) includes a main ramp (1545), and two side ramps (1550). It also includes a cavity (1562) to receive the contact (1505). The barbed features (1525) are designed to secure the insulating element over the conductive element. For example, the conductive element may slide into slots in the cavity (1562). The barbed features (1525) may engage with the sides of the slots to secure the insulating element over the conductive element.

The rear insulating portion (1555) is directly connected to the upper portion (1590). The rear insulating portion (1555) is connected to the front insulating portion (1570) by a flexible portion (1565). For example, the flexible portion (1565) may be a joint or a living hinge. The rear insulating portion (1555) includes an aperture (1530) that is configured to receive a post (1575) on the front insulating portion (1570).

The front insulating portion (1570) is folded upward as shown by the curved arrow. The cavity (1562) in the upper portion (1590) of the hood slips (1540) over the contact (1505) and the barbs (1525) engage with the sides and/or slots in the cavity (1562) to secure the hood onto the conductive element (1500). The front insulating portion (1570) is then rotated about the joint/flexible portion (1565) until the post (1575) fits through the aperture (1530) in the conductive portion/curved flexure (1510) and through the aperture (1572) in the rear insulating portion (1555). The post (1575) is then secured in place. For example, the post (1575) may be pressed so that it expands to fill the apertures (1530) and secure the front insulating portion (1570) to the rear insulating portion (1555) and additionally secure the hood (1540) to the flexible element (1500). A variety of configurations could be used to apply the principles described. For example, the front insulation, and the rear insulation may be secured in a variety of ways including an interference fit, sonic welding, or other appropriate joining technique.

FIG. 15E shows a perspective view of a spring clip (1585). In this view, the hood (1540) is installed over the flexible conductive element (1500) by sliding the contact (1505) into the cavity (1562) and the barbs (1525) into slots on either side of the cavity. This positions the ramps (1550, 1545) to facilitate during the installation of the active cover plate such that the contact (1505) moves into place over the screw terminal. The front insulating portion (1570) covers the front of the flexible conductive portion (1510) and the rear insulating portion (1555) covers the rear of the flexible conductive portion. The preceding description has been presented only to illustrate and describe examples of the principles and features described. This description is not intended to be exhaustive or to limit these principles to any precise form disclosed. Many modifications and variations are possible in light of the above teaching. For example, the front insulation (1570) may include a number of additional components such the protrusions from the face plate as discussed above.

FIGS. 16A-16E are diagrams describing various resilient support (1612, 1614, 1616) that can be used to prevent or mitigate permanent deformation of plastic or other materials used to support electrical contacts. FIGS. 16A and 16B show a prong or clip (1600) for an active cover plate with a plastic support structure that includes a base (1608), a curve (1610), and an upright (1606). A contact (1602) is mounted on the upright (1606) and the conductor (1604) is electrically connected to the contact (1602). FIG. 16A shows the prong (1600) in its neutral position. In one example shown in FIG. 16B, when the prong (1600) comes into contact with a screw terminal or other part of an electrical receptacle, the prong (1600) is bent backwards. This bending can occur anywhere along the upright (1606) but, as illustrated in FIG. 16B, the flexure may primarily occur in the curve (1610). Because the support structure is plastic or other deformable material, it will deform over time and assume a position that is closer to the deflected position than the neutral position. This may be undesirable because it reduces the normal force between the contact and the screw terminal. Further, if the active cover plate is ever removed from that receptacle to a different receptacle, the deformed prongs may not even contact the electrical receptacle.

There are a variety of other ways the prong could be deformed. For example, the prong may be deformed during packaging, handling or installation. A resilient support/insert can improve the prong resiliency and robustness and assist in returning the prong to a desired configuration.

FIGS. 16C, 16D and 16E show various resilient supports (1612, 1614, 1616) that may prevent or mitigate deformation over time. In essence, the internal resilient supports can be deflected without significant plastic deformation and consequently tend to return the prong to its original neutral position. These resilient supports may be internal or external to the support structure. FIG. 16C shows an example of a prong (1600) that includes an internal resilient support (1612) that is not electrically connected to the contact (1602). In this example, the resilient support or stiffening member may be embedded or sandwiched into the upright. Further, the resilient support (1614) may be a strip or sheet of metal or other material as shown in FIG. 16D, or resilient support/insert (1616) with a different cross section such as wire. These or other embodiments of resilient supports could be shaped in any of a variety of ways to secure them to a base/back plate/front plate and to support the prong upright in returning a position that is closer to a neutral or other desired position.

According to one embodiment, an active cover plate may include a face plate, an electrical load and at least one clip extending rearward from the face plate. The clip may include a contact, an upright mechanically supporting the contact, where the contact may be joined to the main upright and passes through the main upright and a rear insulator covers a rear side of the contact and an electrical connection between the clip and the electrical load. The clip may further comprise a stiffening member disposed between the main upright portion and the rear insulator. The stiffening member may be formed from a resilient metal such as a resilient wire or resilient strip. The stiffening member may be a resilient metal that follows the contours of the main upright and moves with the main upright. The stiffening member may include any or all of the following: a base portion, a bent portion, an upright portion and a head portion. The head portion may be narrower than the base portion and the bent portion.

In one example, the active cover plate may include a face plate, an electrical load and at least one clip extending rearward from the face plate. The clip may include a mechanical support and a contact supported by the mechanical support. For example, the mechanical support may be formed from a plastic material that may be permanently deformed. The clip may further comprise a stiffening member joined to the mechanical support that provides additional resilient force to return the mechanical support to a neutral position. As discussed above, the stiffening member may be formed from a resilient metal such as a resilient wire or resilient strip and may be encapsulated, sandwiched, or otherwise joined to the mechanical support. The stiffening member may or may not be connected to the contact.

The figures shown above are only illustrative examples. The concept of a resilient support or stiffening member can be broadly applied to many different prong and clip geometries.

Figure 17A:
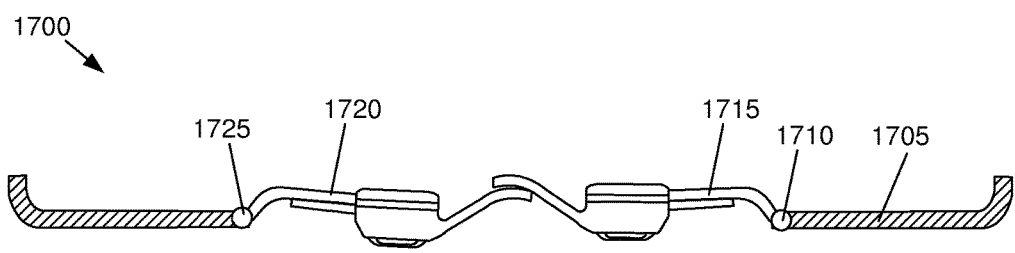
FIGS. 17A and 17B show prongs that are hinged to reduce shipping and packaging volume, according to one embodiment of principles described herein.
Figure 17B:
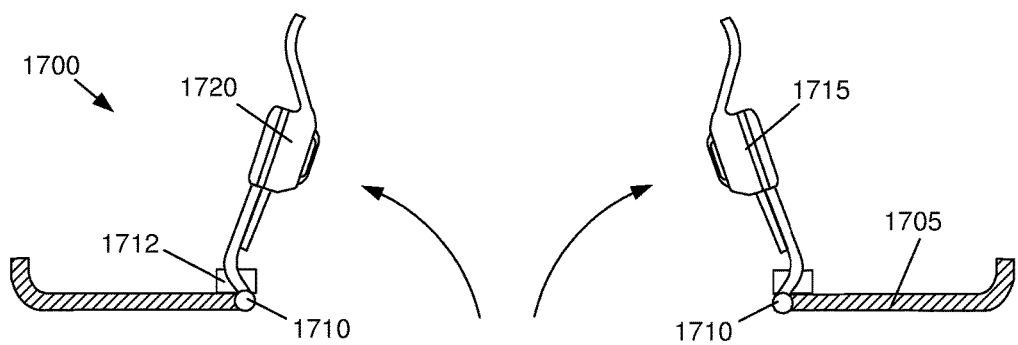

FIGS. 17A and 17B show various cross sectional diagrams of an active cover plate that includes vertically adjustable spring clips with hinge joints. The hinge joints allow the spring clips to be packaged and shipped flat. This can provide a number of advantages including lowering the cost of shipping, decreasing the size and weight of packaging, and protecting the spring clips from damage. FIG. 17A shows a cross sectional view of an active cover plate (1700) that has two hinged spring clips (1715, 1720) that are folded down for shipping or storage. In this simplified diagram, the active cover plate (1700) includes a face plate (1705) and hinges (1710, 1725). Before the active cover plate (1700) is installed, the spring clips (1715, 1720) can be brought into the upright position so that they extend rearward from the face plate as shown in FIG. 17B.

In some examples the hinges are designed to be conductive throughout their range of motion. In other examples, the hinges may only be conductive in their raised position. Alternatively, the hinges may not be conductive. In this case the contact and the moving part of the spring clip may be connected to circuitry in the active cover plate by a flexible wire or make an electrical contact in their upright position. In one implementation, the spring clips lock into their upright position. In this example, a latching mechanism (1712, FIG. 17B) engages with the spring clip when the spring clips are raised. The latching mechanism holds the spring clip in the upright position and prevents the hinge joint from rotating after the latch engages with the spring clip. In other implementations, the spring clips may be held in their raised position by pressure from the contact on the outlet/switch body.

In this example, the latching mechanism (1712) may include a ramp and a slot. When the spring clip is raised, it engages with the ramp on the latching mechanism and then clicks into the slot. This secures the spring clip (1720) in the desired upright position. Although the figures above show hinges that allow the spring clips to lay flat and be raised, there are a variety of other mechanisms that could be used, including flexures, joints, or other suitable rotational mechanisms.

Thus, in some embodiments, an active cover plate may include a face plate and a prong extending from the face plate. The prong may include an upright comprising at least one aperture and a resilient contact comprising a fixed end and a free end. For example, the upright shown in FIG. 2H shows a number of apertures (56, 64) and an aperture (67) behind the resilient contact (46). The upright may be wider than the resilient contact, where the resilient contact may be disposed on an inboard side of the upright; and where the fixed end of the resilient contact may be secured to the upright and at least a portion of the resilient contact extends over the aperture in the upright. In some examples the active cover plate may include a resilient contact with a middle portion between the fixed end and the free end, where at least a part of the middle portion may extend over the aperture in the upright.

In some embodiments, lateral compression of the resilient contact brings the middle portion closer to the aperture and moves the free end with respect to the upright. The prong may also include a base extending at an angle from the upright with the base comprising a wire connection feature. For example, the base may be generally parallel to the plane of a back surface of the face plate. The upright, resilient contact, and base may be formed from a single piece of sheet metal. For example, the metal may be formed using stamping processes. The active cover plate may further comprise a circuit and a wire, where the wire may form a connection to the base to make an electrical connection between the circuit and the prong. The aperture may be generally rectangular aperture through the upright and may include a first short side, a second short side, a first long side and a second long side. The first end of the resilient contact may be connected to the upright proximate to a first short side of the aperture and may extend over the aperture with a free end of the resilient contact more proximate to the second short side than the first short side of the rectangular aperture.

The active cover plate may also include electrical insulation and the upright may include at least one additional aperture and the upright may be at least partially secured to the electrical insulation using at least one additional aperture. For example, a portion of the electrical insulation may extend through an additional aperture in the upright. The upright may include edges that engage with the electrical insulation to at least partially secure the upright to the electrical insulation. The upright may include shoulders proximal to the face plate that are wider than portions of the upright that are more distal from the face plate.

In some embodiments there may be multiple resilient contacts on a prong. For example, the resilient contact may include a first resilient contact and the prong may include a second aperture and a second resilient contact extending over the second aperture. The second resilient contact may be longitudinally spaced from the first resilient contact. The active cover plate may also include a rear insulator that includes a wall outboard from the upright, where an outboard surface of the upright and the inboard surface of the outboard wall may be substantially flat, parallel, contiguous and fixed relative to each other.

In some embodiments, the active cover plate may extend in longitudinal, lateral, and transverse directions that are orthogonal to one another. The active cover plate may include a front plate comprising a front surface, a back surface, and an electrical receptacle aperture. The electrical receptacle aperture may extend through the front plate in the transverse direction. The prong may be connecting to the back surface of the front plate at a location outboard of the electrical receptacle aperture. The prong may extend rearward away from the back surface of the front plate in the transverse direction. A back plate may include a protrusion extending from a back surface of the back plate in the transverse direction and the protrusion may include an outboard wall and lateral walls joined to opposite edges of the outboard wall. The protrusion may be an integrally molded feature of the back plate and the outboard wall and lateral walls may define a partially enclosed volume. The protrusion may include insulation that covers at least a portion of an outboard side of the prong. In some embodiment, the outboard and lateral walls of the protrusion may form a U channel with the prong at least partially disposed within an interior volume enclosed by the U channel. Lateral compression of the prong may bring the prong into contact with the protrusion. For example, the lateral compression of the prong may bring the prong into direct contact with the inner side of the outboard wall of the protrusion.

The prong may include a cantilever comprising a fixed end connected to a support and a free end, where the free end of the prong may be configured to contact the inner side of the outboard wall of the protrusion when the cantilever is deformed. The contact may also increase bending stiffness of the prong between the free end of the cantilever when the prong contacts the inner wall of the protrusion. The contact between the free end of the cantilever and inner wall of the protrusion may change the bending behavior of the cantilever or resilient strip. In some examples, the fixed end may be fixed with respect to the protrusion.

In some embodiments, the protrusion may include at least one partially open face on its inboard side, where the prong may extend from and may compress into the partially open face. The protrusion may also include an open top side that is in a transverse direction opposite the face plate. The back plate and protrusion may be connected to the face plate by posts molded into the surface of the face plate and the posts may pass through corresponding apertures in the back plate.

In some embodiments, a wall-plate system may extend in longitudinal, lateral, and transverse directions that are orthogonal to one another and the wall-plate system may include a front plate comprising a front surface, a back surface. The front plate may include an electrical receptacle aperture that extends through the front plate in the transverse direction. The wall-plate system may further comprise a first prong connecting to the back surface of the front plate at a location outboard of the electrical receptacle aperture. The first prong may extend rearward away from the back surface of the front plate in the transverse direction. The first prong may include a first upright extending rearward away from the back surface of the front plate in the transverse direction and a first insulating back element. The first insulating back element may cover an outboard side of the first upright and left and right edges of the upright. The first insulating back element may be secured to the upright through at least one aperture in the upright. The first resilient contact may be located on an inboard side of the first upright and the first resilient contact may include a first end, second end, and middle portion; and where the first end of the first resilient contact may be fixed with respect to the first upright.

A second prong may connect to the back surface of the front plate at a location outboard of the outlet aperture. The second prong may extend rearward away from the back surface of the front plate in the transverse direction. There may be a second insulating back element that may cover an outboard side of the second upright and left and right edges of the upright. The second insulating back element may be secured to the upright through at least one aperture in the upright. The second resilient contact may be located on an inboard side of the second upright and may include a first end, second end, and middle portion; and where the first end of the second resilient contact may be fixed with respect to the second upright. The second prong may connect to the back surface of the front plate at a location outboard of the outlet aperture. The second prong may be opposite the first prong across the electrical receptacle aperture. The wall plate system may include the first and second prongs each with two resilient contacts. The two resilient contacts may be spaced such that a first resilient contact on each of the first and second prongs contacts a first screw terminal of an electrical receptacle when the wall plate system is fastened over the electrical receptacle in a first orientation and the second resilient contact on each of the first and second prongs contacts the first screw terminal when the wall plate system is fastened over the electrical receptacle in a second orientation. The two resilient contacts on each of the first and second prongs may be spaced such that the wall plate is configured to receive power when the wall plate system is placed over an electrical receptacle in at least two different orientations. The two resilient contacts are longitudinally offset from each other and are configured to compress independently, where there may be a gap between the two resilient contacts that is greater than longitudinal width of the resilient contacts.

In some embodiments, an active cover plate may include a face plate with an aperture and a prong extending from the face plate. The prong may include rear insulation and front insulation. The rear insulation and front insulation may define an opening with an electrical contact extending through the opening. In some embodiments, the rear insulation may include at least three sides define an interior space. The prong may include an upright and the rear insulation may cover at least three sides of the upright. The rear insulation may cover at least a portion of the back of the upright, at least a portion of the sides of the upright, and at least a portion of the front of the upright. Additionally or alternatively, the active cover plate may include a hinged connection between the face plate and the prong. The prong and hinged connection may be configured to allow the prong to rotate toward the plane of the face plate for shipping and rotate away from the plate of the face plate for installation. Additionally or alternatively, the prong may also include a resilient insert that may include resilient metal that is not electrically connected to the contact. The front insulation and rear insulation may be joined in a variety of ways including being joined by posts passing through a conductor supporting the electrical contact. In some embodiments, the electrical contact may include a bowed contact extending through the opening with a terminal end of the bowed contact extending into a cavity in prong. The terminal end of the bowed contact may be configured to move farther into the cavity when the bowed contact is compressed.

The prong may further comprise an upright wherein a first end of the bowed contact is connected to the upright and a second end of the bowed contact is not connected to the upright and is free to move with respect to the upright. The active cover plate of claim 1, wherein the prong comprises a first electrical contact and a second electrical contact, wherein the first contact and second contact are transversely or longitudinally offset from each other. The first contact and second contact may include a first bowed contact and a second bowed contact. In some embodiments, the prong may include one support supporting both the first contact and second contact. The support includes a conductive base and wherein the first contact and second contact are electrically connected to each other by circuitry or electrically connected by the conductive base. In some embodiments the front insulation and rear insulation may interface to form the opening.

Some examples of active cover plates that are configured to interface with an electrical receptacle that include principles described herein may include a face plate comprising an aperture, at least one prong extending from the face plate and configured to make electrical contact with an electrified terminal of an electrical receptacle. The prong may include a conductor that may include an upright and a contact and insulation that may include at least three solid sides and an open side. The three solid sides may cover at least a portion of the at least three sides of the upright and the contact may extend out of the open side. The active cover plate may also include a back plate that may be joined to the face plate and at least a portion of the insulation may be an integrally formed element of the back plate. In some examples, the insulation may include rear insulation and front insulation wherein the front insulation may include a protrusion on the face plate extending rearward to cover at least a portion of the inboard side of the conductor. The conductor may include a formed metal sheet with a base connected to and in plane with the face plate, a bend, and the upright. In one example, the contact may be connected to and extend from the upright. In some embodiments, the protrusion on the face plate may at least partially cover an inboard side of the bend of the formed metal sheet. In one example, the insulation may substantially cover four sides of the upright and/or the insulation may substantially covers an outboard side, a left side, a right side and at least a portion of an inboard side of the upright. The insulation may include a slot and the upright may engage with the slot to secure the contact with respect to the insulation.

Additionally or alternatively, an active cover plate configure to interface with an electrical receptacle may include a face plate comprising an aperture configured to accept an electrical receptacle and at least one prong extending from the face plate. The prong may include insulation that includes a cavity and an electrical conductor that may include a support at least partially disposed in the cavity, and a contact where at least a portion of the contact may extend from the support through an opening in the insulation. The contact and the support may be formed from a single piece of sheet metal. The opening may include an aperture in a side of the cavity and at least a portion of the support may be secured in the cavity. Additionally or alternatively, at least a portion of the contact may extend from the support through an opening in the cavity. The insulation may include front and rear insulation wherein the front and rear insulation interface to form the cavity. In some embodiments, at least a portion of the support may be disposed in and secured in the cavity. The contact may include a first end secured to the support, a middle portion extending from the opening in the insulation, and an opposite free end extending into the cavity and configured to move within the cavity. The contact may include a bowed contact with one end secured to the support and an opposite end of the bowed contact extending into the cavity. The opposite end of the bowed contact may be configured to extend deeper into the cavity when the bowed contact is compressed and to retract when the contact relaxes. The insulation may include a slot and wherein the support is configured to engage with the slot. The contact may include a bowed contact and the support may be secured in a slot in the insulation and the bowed contact may extend from the support and may terminate in a free end that may be captured in the cavity and is may be configured to move within the cavity.

The preceding description has been presented only to illustrate and describe examples of the principles and features described. This description is not intended to be exhaustive or to limit these principles to any precise form disclosed. Many modifications and variations are possible in light of the above teaching.

What is claimed is:

1. An active cover plate comprising:
   a face plate comprising an aperture;
   a prong extending from a back of the face plate, wherein the prong comprises:
   rear insulation comprising at least three sides defining an interior space;
   front insulation abutting the rear insulation and further enclosing the interior space, wherein the rear insulation and front insulation define an opening to the interior space; and
   an electrical contact extending inboard through the opening, wherein the electrical contact is to contact a side screw terminal of an electrical receptacle.

2. The active cover plate of claim 1, wherein the prong further comprises an upright, wherein the upright is enclosed within the interior space.

3. The active cover plate of claim 2, wherein the rear insulation covers at least a portion of a back of the upright, at least a portion of sides of the upright, and at least a portion of a front of the upright.

4. The active cover plate of claim 1, further comprising a back plate, wherein the back plate is joined to the face plate and wherein the rear insulation is an integrally formed element of the back plate.

5. The active cover plate of claim 1, further comprising a back plate, wherein the back plate and the face plate are joined by multiple posts extending transversely from the face plate to engage multiple holes in the back plate, each hole corresponding to a post.

6. The active cover plate of claim 1, wherein the electrical contact comprises a bowed contact extending through the opening and wherein a terminal end of the bowed contact extends into a cavity in the prong, the terminal end of the bowed contact being configured to move farther into the cavity when the bowed contact is compressed.

7. The active cover plate of claim 1, wherein the prong further comprises an upright wherein a first end of the electrical contact is connected to the upright and a second end of the electrical contact is not connected to the upright and is free to move with respect to the upright.

8. The active cover plate of claim 1, wherein the front insulation and rear insulation interface to form the opening.

9. An active cover plate comprising:
   a face plate;
   a prong extending from a back of the face plate, wherein the prong comprises:
   (1) a metal clip comprising an upright and a spring; and
   (2) an insulating element comprising at least three solid sides and an at least partially open side, wherein the at least three solid sides cover at least a portion of at least three sides of the upright;
   a circuit; and
   a wire connecting the metal clip to the circuit;
   wherein the spring extends from the upright and out of the at least partially open side of the insulating element.

10. The active cover plate of claim 9, further comprising a back plate, wherein the back plate is joined to the face plate and wherein at least a portion of the insulating element is an integrally formed element of the back plate.

11. The active cover plate of claim 9, wherein the insulating element comprises rear insulation and front insulation, wherein the front insulation comprises a protrusion on the face plate extending rearward to cover at least a portion of the inboard side of the metal clip.

12. The active cover plate of claim 11, wherein the metal clip comprises a formed metal sheet connected at a base end to the face plate and the upright, wherein the spring is connected to the upright at a bend, wherein the protrusion on the face plate at least partially covers an inboard side of the formed metal sheet between the base end and the bend.

13. The active cover plate of claim 9, wherein the insulating element substantially covers at least four sides of the upright.

14. The active cover plate of claim 9, wherein the insulating element substantially covers an outboard side, a left side, a right side and at least a portion of an inboard side of the upright.

15. The active cover plate of claim 9, wherein the insulating element comprises a slot, wherein the upright engages with the slot to secure the spring with respect to the insulation.

16. The active cover plate of claim 9, wherein the spring comprises a first electrical contact and the prong further comprises a second electrical contact, wherein the first contact and second contact are transversely or longitudinally offset from each other.

17. The active cover plate of claim 16, wherein the first contact and second contact comprise a first bowed contact and a second bowed contact.

18. The active cover plate of claim 16, wherein the prong comprises one support supporting both the first contact and second contact.

19. The active cover plate of claim 18, wherein the support comprises a conductive base and wherein the first contact and second contact are electrically connected to each other by circuitry or electrically connected by the conductive base.

20. An active cover plate configured to interface with an electrical receptacle comprising:
a face plate comprising an aperture; and
at least one prong extending from a back of the face plate, wherein the prong comprises:
insulation comprising a cavity, an inboard surface, and an outboard surface, and
a metal clip comprising (1) a support at least partially disposed in the cavity and (2) a contact, wherein at least a portion of the contact extends from the support through an opening in the inboard surface of the insulation.

21. The active cover plate of claim 20, wherein the contact and the support are formed from a single piece of sheet metal and wherein the opening comprises an aperture in a side of the cavity, wherein at least a portion of the support is secured in the cavity and at least a portion of the contact extends from the support through an opening in the cavity.

22. The active cover plate of claim 20, wherein the insulation comprises upper and lower insulation wherein the upper and lower insulation interface to form the cavity, wherein at least a portion of the support is disposed in and secured in the cavity.

23. The active cover plate of claim 20, wherein the contact comprises a first end secured to the support, a middle portion extending from the opening in the insulation, and an opposite free end extending into the cavity and configured to move within the cavity.

24. The active cover plate of claim 20, wherein the contact comprises a bowed contact with one end secured to the support and an opposite end of the bowed contact extends into the cavity, wherein the opposite end of the bowed contact is configured to extend deeper into the cavity when the bowed contact is compressed and to retract when the contact relaxes.

25. The active cover plate of claim 20, wherein the insulation comprises a slot and wherein the support is retained in the slot.

26. The active cover plate of claim 20, wherein the contact comprises a bowed contact and the support is secured in a slot in the insulation and the bowed contact extends from the support and terminates in a free end that is captured in the cavity and is configured to move within the cavity.

* * * * *